(12) United States Patent
Jiang et al.

(10) Patent No.: US 11,145,664 B2
(45) Date of Patent: *Oct. 12, 2021

(54) FERROELECTRIC MEMORY IC AS WELL AS METHOD OF OPERATING THE SAME AND METHOD OF PREPARING THE SAME

(71) Applicant: Fudan University, Shanghai (CN)

(72) Inventors: Anquan Jiang, Shanghai (CN); Yan Zhang, Shanghai (CN); Zilong Bai, Shanghai (CN)

(73) Assignee: Fudan University, Shanghai (CN)

( * ) Notice: Subject to any disclaimer, the term of this patent is extended or adjusted under 35 U.S.C. 154(b) by 172 days.

This patent is subject to a terminal disclaimer.

(21) Appl. No.: 16/322,032

(22) PCT Filed: Feb. 28, 2018

(86) PCT No.: PCT/CN2018/077485
§ 371 (c)(1),
(2) Date: Jan. 30, 2019

(87) PCT Pub. No.: WO2019/047489
PCT Pub. Date: Mar. 14, 2019

(65) Prior Publication Data
US 2020/0243549 A1    Jul. 30, 2020
US 2021/0202509 A9    Jul. 1, 2021

(30) Foreign Application Priority Data
Sep. 6, 2017 (CN) .......................... 201710793719.9

(51) Int. Cl.
*G11C 11/22* (2006.01)
*H01L 27/11507* (2017.01)

(52) U.S. Cl.
CPC ...... *H01L 27/11507* (2013.01); *G11C 11/221* (2013.01); *G11C 11/2259* (2013.01); *G11C 11/2273* (2013.01); *G11C 11/2275* (2013.01)

(58) Field of Classification Search
CPC .................................................. G11C 11/221
(Continued)

(56) References Cited

U.S. PATENT DOCUMENTS 10,403,348 B2 *   9/2019   Jiang ................... G11C 11/2275

FOREIGN PATENT DOCUMENTS

| CN | 105256376 A | 1/2016 |
| CN | 105655342 A | 6/2016 |

(Continued)

OTHER PUBLICATIONS

Machine assisted English translation of CN105655342A obtained from https://worldwide.espacenet.com on Aug. 15, 2019, 15 pages.
(Continued)

*Primary Examiner* — Hoai V Ho
(74) *Attorney, Agent, or Firm* — Warner Norcross + Judd LLP

(57) ABSTRACT

Disclosed is an integrated circuit for ferroelectric memory, the integrated circuit comprising: a ferroelectric memory array having a storage unit array formed on a ferroelectric single-crystal layer, wherein each ferroelectric memory unit in the ferroelectric memory array is at least formed by one storage unit in the storage unit array, or at least formed by one storage unit in the storage unit array and one transistor formed on a silicon substrate of a silicon-based reading and writing circuit that is electrically connected to the storage unit.

23 Claims, 13 Drawing Sheets

(58) Field of Classification Search
USPC .......................................................... 365/145
See application file for complete search history.

(56) References Cited

FOREIGN PATENT DOCUMENTS

CN    107123648 A    9/2017
CN    107481751 A    12/2017

OTHER PUBLICATIONS

Machine assisted English translation of CN107123648A obtained from https://worldwide.espacenet.com on Aug. 15, 2019, 9 pages.
English translation of International Search Report for International Application No. PCT/CN2018/077485 dated Jun. 12, 2018, 3 pages.
Machine assisted translation of CN105256376A obtained from https://patents.google.com/patent on Apr. 11, 2019, 8 pages.
Machine assisted translation of CN107481751A obtained from https://patents.google.com/patent on Apr. 11, 2019, 13 pages.
Xu, Shuai-Qi et al., "Improved Polarization Retention of BiFeO3 Thin Films Using GdScO3 (110) Substrates", Chinese Physics Letters, Jan. 25, 2017, 34(2), 027701-1-027701-4.

* cited by examiner

FERROELECTRIC MEMORY IC AS WELL AS METHOD OF OPERATING THE SAME AND METHOD OF PREPARING THE SAME

CROSS-REFERENCE TO RELATED APPLICATIONS

This application is a national phase entry of PCT/CN2018/077485, filed Feb. 28, 2018, which claims priority to Chinese Patent Application No. 201710793719.9, filed Sep. 6, 2017, both of which are incorporated herein by reference in their entirety.

FIELD OF THE INVENTION

The present invention pertains to the technical field of ferroelectric memory, and relates to a ferroelectric memory array which conducts electricity based on electric domain wall, an integrated circuit (IC) for ferroelectric memory as well as a method of preparing the same and a method of operating the same. In particular, the invention relates to a method of designing an integrated circuit for ferroelectric memory of a crossbar structure and one switch transistor and one ferroelectric memory unit (1T1R) structure, as well as a method of manufacturing the same.

BACKGROUND

Conventional ferroelectric memories store information in a non-volatile way by taking advantage of the fact that ferroelectric materials can maintain the polarized state. When a voltage that is sufficiently large is applied to a ferroelectric capacitor (C), the polarization direction of the ferroelectric capacitor is consistent with the voltage direction, and after the voltage is cancelled, the polarization direction of the ferroelectric capacitor keeps unchanged; when a voltage that is sufficiently large is applied to the capacitor in the opposite direction, the polarization direction of the capacitor is reversed, and after the voltage is cancelled, the polarization direction of the capacitor keeps unchanged. As such, a Boolean logic value "1" or "0" is stored according to the different polarization directions of the ferroelectric capacitor.

This type of ferroelectric capacitor has advantages of high residual polarization, good coercive field, high fatigue resistance, low drain current or the like, and was already used for integrated circuit for ferroelectric memory dating back to 1950s, see U.S. Pat. No. 2,876,436 owned by J. R. Anderson et al., published in 1959. Thereafter, the technical field of ferroelectric memory is mainly dedicated to the improvement of the structure of storage unit and the reading and writing circuit. For example, see U.S. Pat. No. 4,873,664 owned by S. Sheffield Eaton, Jr et al., published in 1989, U.S. Pat. No. 4,888,733 owned by Kenneth J. Mobely et al., published in 1989, U.S. Pat. No. 5,523,964 owned by L. D. McMillan et al., published in 1996, U.S. Pat. No. 5,572,459 owned by D. R. Wilson et al., published in 1998 and U.S. Pat. No. 7,652,909B2 owned by X. H. Du et al., published in 2010, all of which relate to 2T2C, 1T1C, reference circuit and addressing circuit, etc. However, they are generally the same in the principle of the reading circuit, and mainly read the charges in the ferroelectric capacitor.

However, with the reduction of the size of ferroelectric capacitor year by year, the charge quantity that can be read is also reduced, which puts very high requirements on the charge detection circuit and further increases the reading/writing time and the complexity of the circuit, thus adversely influencing the improvement of the integration level. Moreover, in each time of reading, the charge quantity in the capacitor is destructively read, thus requiring re-writing of the charges and increasing the reading/writing time of the circuit.

In U.S. Pat. No. 5,744,374 owned by J. Moon et al., published in 1998, a metal-ferroelectric-insulator-semiconductor field effect transistor (MFIS FET) structure is employed. This structure is simple, has only one transistor, and is completely compatible with the current CMOS process, which can simplify the reading/writing circuit. Moreover, the information is read in a non-destructive way. However, very high requirements are put on the quality of the ferroelectric single-crystal thin film layer on the gate electrode and the interface thereof, which is very adverse to the reduction of the size and the improvement of the rate of finished products.

In recent years, the domain wall conductivity in ferroelectric materials has aroused widespread interests in academia (see for example Seidel J, Martin L W, He Q, et al. Conduction at domain walls in oxide multiferroics. Nature materials, 2009, 8(3): 229.). The inventor of this application has proposed a ferroelectric memory based on domain wall conductivity (see China patent application No. CN201510036526.X, CN201510036586.1, CN201610098138.9 and US patent publication No. U.S. Pat. No. 9,685,216B2).

SUMMARY OF THE INVENTION

According to a first aspect of the invention, an integrated circuit for ferroelectric memory is provided, comprising:

a ferroelectric memory array having a storage unit array formed on a ferroelectric single-crystal layer;

a silicon-based reading and writing circuit;

wherein each storage unit in the storage unit array is correspondingly provided with a first electrode and a second electrode, and a polarization direction of the electric domain of the ferroelectric single-crystal layer is substantially not parallel with a normal direction of the ferroelectric single-crystal layer; when an electrical signal is applied between the first electrode and the second electrode, the electric domain of the ferroelectric single-crystal layer for forming the storage unit and substantially located between the first electrode and the second electrode can be reversed, thus enabling establishment of a domain wall conductive passage which connects the first electrode with the second electrode; and wherein each ferroelectric memory unit in the ferroelectric memory array is mainly formed by one storage unit in the storage unit array, or mainly formed by one storage unit in the storage unit array and one transistor formed on the silicon substrate of the silicon-based reading and writing circuit and electrically connected to the storage unit.

According to a second aspect of the invention, a ferroelectric memory array is provided, wherein the ferroelectric memory array comprises a storage unit array formed on a ferroelectric single-crystal layer;

wherein each storage unit in the storage unit array is correspondingly provided with a first electrode and a second electrode, and a polarization direction of the electric domain of the ferroelectric single-crystal layer is substantially not parallel with a normal direction of the ferroelectric single-crystal layer; when an electrical signal is applied between the first electrode and the second electrode, the electric domain of the ferroelectric single-crystal layer for forming the storage unit and substantially located between the first electrode and the second electrode can be reversed, thus enabling establishment of a domain wall conductive passage which connects the first electrode with the second electrode; and wherein each ferroelectric memory unit in the ferroelectric memory array is mainly formed by one storage unit in the storage unit array.

According to a third aspect of the invention, a method of operating the above integrated circuit for ferroelectric memory is provided, comprising:

a step of writing storage information "1", in which a write signal is applied between the first electrode and the second electrode in a first direction so that at least a part of the electric domain of the storage unit is reversed and the domain wall conductive passage is therefore established; and a step of reading the storage information, in which a read signal is applied between the first electrode and the second electrode in the first direction and the magnitude of the voltage of the read signal is smaller than a coercive field voltage of the storage unit.

According to a fourth aspect of the invention, a method of preparing the above integrated circuit for ferroelectric memory is provided, comprising the steps of:

providing a ferroelectric single-crystal substrate as a ferroelectric single-crystal substrate;

patterning and forming the storage unit array on the ferroelectric single-crystal substrate;

patterning and forming the first electrode and the second electrode as well as plate lines connected with the first electrode/second electrode over the ferroelectric single-crystal substrate;

growing an insulation layer over the ferroelectric single-crystal substrate;

forming a silicon-based thin film layer over the insulation layer using a SOI process or epitaxial growing method; and forming the silicon-based reading and writing circuit and bit lines on the silicon-based thin film layer.

According to a fifth aspect of the invention, a method of preparing the above integrated circuit for ferroelectric memory is provided, comprising the steps of:

providing a single-crystal silicon substrate;

forming the silicon-based reading and writing circuit and bit lines on the single-crystal silicon substrate;

growing an insulation layer over the silicon-based reading and writing circuit and bit lines;

forming a ferroelectric single-crystal thin film layer as a ferroelectric single-crystal layer over the insulation layer using a SOI process or epitaxial growing method;

patterning and forming the storage unit array on the ferroelectric single-crystal thin film layer; and patterning and forming the first electrode and the second electrode as well as plate lines connected with the first electrode/second electrode over the ferroelectric single-crystal thin film layer.

According to a sixth aspect of the invention, a method of preparing the above integrated circuit for ferroelectric memory is provided, comprising the steps of:

providing a single-crystal silicon substrate;

forming the silicon-based reading and writing circuit and bit lines on the single-crystal silicon substrate;

growing an insulation layer over the silicon-based reading and writing circuit and bit lines;

forming a first electrode in the insulation layer;

forming a ferroelectric single-crystal thin film layer as a ferroelectric single-crystal layer over the insulation layer using a SOI process or epitaxial growing method; and patterning and forming the second electrode which is substantially vertically aligned with the first electrode as well as plate lines connected with the second electrode over the ferroelectric single-crystal thin film layer.

The above features and operations of the invention will become more apparent from the following description and accompanying drawings.

BRIEF DESCRIPTION OF THE DRAWINGS

The above and other objectives and advantages of the invention will become thoroughly clear from the following detailed description in connection with the accompanying drawings, wherein identical or similar elements are denoted by identical reference numerals.

DETAILED DESCRIPTION OF THE INVENTION

Figure 1:
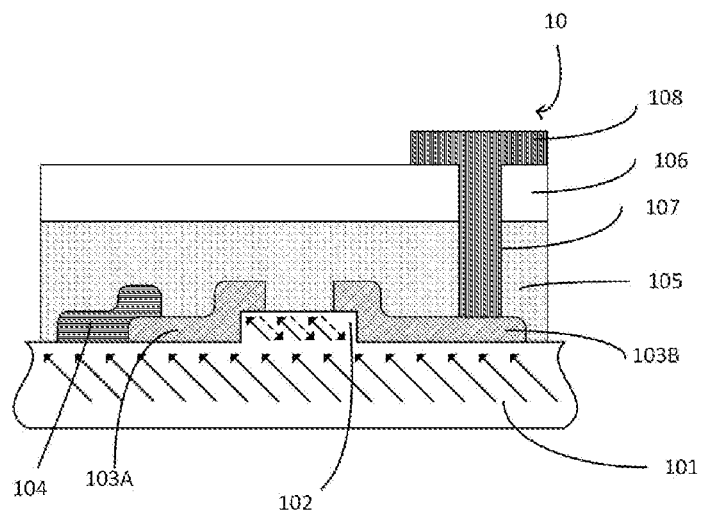
FIG. 1 is a schematic sectional structure view of a crossbar structure of a ferroelectric memory unit of the integrated circuit for ferroelectric memory according to a first embodiment of the invention.

Hereinafter, some of many possible embodiments of the invention will be described in order to provide a basic understanding of the invention and not to identify crucial or decisive elements of the invention or define the scope of protection.

In the drawings, the thicknesses of layers and areas have been exaggerated for clarity. The dimensional scaling relationship among the portions shown in the drawings does not reflect an actual dimensional scaling relationship.

In the following embodiments, an electric domain direction or polarization direction is illustratively given for the purpose of a clear description. However, it is to be understood that the electric domain direction or polarization direction of ferroelectric memory is not limited to the direction shown in the embodiment in the drawings.

Herein, the ferroelectric single-crystal refers to a single-crystal structure or a quasi single-crystal structure having no "crystal boundaries" of a poly-crystal structure inside. The storage unit of the storage unit array formed on the ferroelectric single-crystal is also a single-crystal structure, and there is no limitation to the size of the storage unit. The ferroelectric single-crystal can be a ferroelectric single-crystal thin film layer or a ferroelectric single-crystal substrate, and the ferroelectric single-crystal thin film layer can be a single-crystal thin film formed by epitaxial single-crystal growth, or a thin film layer formed by being separated from or cutting a ferroelectric single-crystal substrate.

In the following embodiments, the integrated circuit for ferroelectric memory comprises a ferroelectric memory array, and a plurality of ferroelectric memory units in the ferroelectric memory array are arranged in rows and columns; as such, by means of a reading and writing circuit, the ferroelectric memory unit at the corresponding row and corresponding column can be selected for corresponding writing operation or reading operation. It is noted that the specific number, arrangement or the like of the ferroelectric memory units in the ferroelectric memory array are not limiting.

FIG. 1 is a schematic sectional structure view of a crossbar structure of a ferroelectric memory unit of the integrated circuit for ferroelectric memory according to a first embodiment of the invention. An integrated circuit 10 for ferroelectric memory of this embodiment comprises a ferroelectric single-crystal substrate 101, on which a storage unit array 102 is formed by etching. A first electrode 103A and a second electrode 103B are formed on left and right ends of each storage unit 102 respectively; in an embodiment, the integrated circuit 10 for ferroelectric memory further comprises an insulation layer 105 over the above structure of the ferroelectric single-crystal substrate 101, a silicon-based reading and writing circuit 106 placed over the insulation layer 105, electrode plate lines 104 and bit lines 108, wherein the electrode plate lines 104 are also referred to as plate lines, or as drive lines, and the bit lines 108 can be for example connected with the second electrode 103B of the storage unit 102 at the corresponding column via a contact hole 107 formed in the insulation layer 105.

Figure 2:
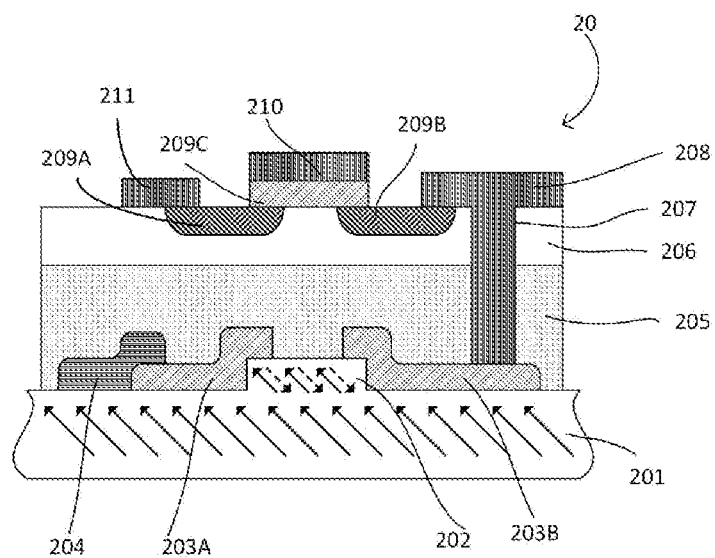
FIG. 2 is a schematic sectional structure view of a 1T1R structure of a ferroelectric memory unit of the integrated circuit for ferroelectric memory according to a second embodiment of the invention.

FIG. 2 is a schematic sectional structure view of a 1T1R structure of a ferroelectric memory unit of the integrated circuit for ferroelectric memory according to a second embodiment of the invention. An integrated circuit 20 for ferroelectric memory comprises a ferroelectric single-crystal substrate 201, on which a storage unit array 202 is formed by etching. A first electrode 203A and a second electrode 203B are formed on left and right ends of each storage unit 202 respectively; in an embodiment, the integrated circuit 20 for ferroelectric memory further comprises an insulation layer 205, a silicon-based reading and writing circuit 206 placed over the insulation layer 205, and a transistor array 209, wherein the transistor array 209 is formed on a silicon substrate of the silicon-based reading and writing circuit 206, each transistor of the transistor array 209 is used to control selective switch-on of a corresponding storage unit, and is therefore also referred to as switch transistor; each transistor of the transistor array 209 has a gate electrode 209C, a source electrode 209A and a drain electrode 209B, and by controlling a switch control signal applied to the gate electrode 209C, on/off between the source electrode 209A and the drain electrode 209B is controlled. In an embodiment, the integrated circuit 20 for ferroelectric memory further comprises electrode plate lines 204, bit lines 211 and word lines 210, wherein the electrode plate lines 204 are also referred to as plate lines, or as drive lines, the bit lines 208 can be for example connected with the second electrode 203B of the storage unit 202 at the corresponding column via a contact hole 107 formed in the insulation layer 205, and the bit lines 208 are also for example connected with the drain electrode 209B of the transistor at the corresponding column.

As shown in FIGS. 1 and 2, the ferroelectric single-crystal substrate 101 or 201 can for example be but is not limited to a ferroelectric single-crystal epitaxial substrate; for example, it can be formed by epitaxial growth of a layer of ferroelectric thin film (e.g., BiFeO3 or the like) on a common single-crystal substrate (e.g., in (100) orientation of a SrTiO$_3$ single-crystal substrate).

Figure 3:
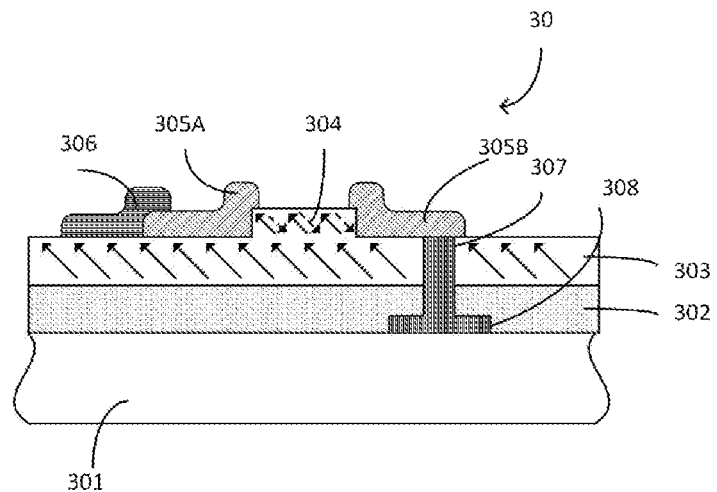
FIG. 3 is a schematic sectional structure view of a crossbar structure of a ferroelectric memory unit of the integrated circuit for ferroelectric memory according to a third embodiment of the invention.

FIG. 3 is a schematic sectional structure view of a crossbar structure of a ferroelectric memory unit of the integrated circuit for ferroelectric memory according to a third embodiment of the invention. As shown in FIG. 3, an integrated circuit 30 for ferroelectric memory may comprise a silicon-based reading and writing circuit 301, an insulation layer 302, a ferroelectric single-crystal thin film layer 303, a storage unit array 304 formed by etching on the ferroelectric single-crystal thin film layer 303, a first electrode 305A and a second electrode 305B formed on both ends of the storage unit array 304, plate lines 306 and bit lines 308, wherein the silicon-based reading and writing circuit 301 can be for example formed by a single-crystal silicon substrate or the like, the insulation layer 302 is located between the silicon-based reading and writing circuit 301 and the ferroelectric single-crystal thin film layer 303, the ferroelectric single-crystal thin film layer 303 is manly used to form the storage unit array 304, and the storage unit of the storage unit array 304 is electrically connected with the bit lines 308 formed over the silicon-based reading and writing circuit 301 via a contact hole 307 in the insulation layer 302.

Figure 4:
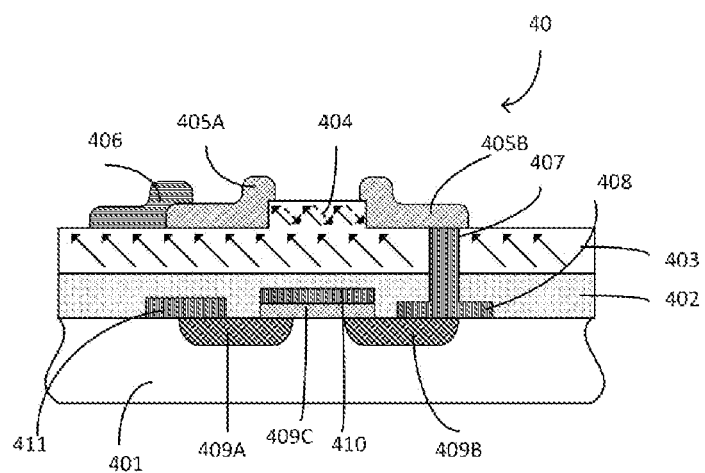
FIG. 4 is a schematic sectional structure view of a 1T1R structure of a ferroelectric memory unit of the integrated circuit for ferroelectric memory according to a fourth embodiment of the invention.

FIG. 4 is a schematic sectional structure view of a 1T1R structure of a ferroelectric memory unit of the integrated circuit for ferroelectric memory according to a fourth embodiment of the invention. As shown in FIG. 4, an integrated circuit 40 for ferroelectric memory may comprise a silicon-based reading and writing circuit 401 and a transistor array 409, wherein the silicon-based reading and writing circuit 401 can be for example formed by a single-crystal silicon substrate or the like, and the transistor array 409 can also be for example formed by a single-crystal silicon substrate or the like; the integrated circuit 40 for ferroelectric memory may also comprise an insulation layer 402, a ferroelectric single-crystal thin film layer 403, a storage unit array 404 formed by etching on the ferroelectric single-crystal thin film layer 403, and a first electrode 405A and a second electrode 405B formed on left and right ends of the storage unit array 404, and further comprises electrode plate lines 406, bit lines 411 and word lines 410.

Each transistor in the transistor array 409 is used for selectively switching on the storage unit in the storage unit array 404 connected therewith, and has a gate electrode 409C, a source electrode 409A and a drain electrode 409B; through a switch control signal applied to the gate electrode 409C, on/off of the electrical connection between the bit lines 411 and the corresponding storage unit can be controlled; the bit lines 411 are connected with a source electrode or a drain electrode (e.g., the source electrode 409A) of the transistor 409 of the ferroelectric memory unit at the corresponding column of the ferroelectric memory array, and the word lines 410 are connected with the gate electrode 409C of the transistor 409 of the ferroelectric memory unit at the corresponding column of the ferroelectric memory array; for example, the word lines 410 are formed on the gate electrode 409C of the transistor 409 at the corresponding column by patterning.

Figure 5:
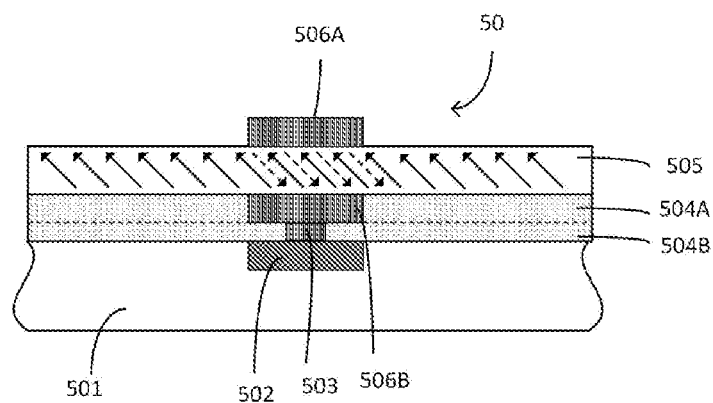
FIG. 5 is a schematic sectional structure view of a crossbar structure of a ferroelectric memory unit of the integrated circuit for ferroelectric memory according to a fifth embodiment of the invention.

FIG. 5 is a schematic sectional structure view of a crossbar structure of a ferroelectric memory unit of the integrated circuit for ferroelectric memory according to a fifth embodiment of the invention. As shown in FIG. 5, an integrated circuit 50 for ferroelectric memory may comprise a silicon-based reading and writing circuit 501, bit lines 502, and a contact hole 503, wherein conductive lines in the contact hole 503 can electrically connect the bit lines 502 with a second electrode 506B; the integrated circuit 50 for ferroelectric memory may further comprise an insulation layer 504, a ferroelectric single-crystal thin film layer 505 and a first electrode 506A over the ferroelectric single-crystal thin film layer 505.

The first electrode 506A can also be a part of the electrode plate lines, and the electrode plate lines connect a plurality of first electrodes 506A of the storage unit of the ferroelectric memory unit at a corresponding row or column. The first electrodes 506A may be formed on upper and lower sides of the ferroelectric single-crystal thin film layer 505 in a way of being substantially aligned with the second electrodes 506B. The second electrodes 506B may be specifically formed in the insulation layer 504 by patterning. In this embodiment, the insulation layer 504 comprises a lower insulation layer 504B and an upper insulation layer 504A.

A part of the ferroelectric single-crystal thin film layer 505 that is located between the first electrode 506A and the second electrode 506B constitutes the storage unit of the embodiment of the invention. Therefore, when an electrical signal is applied between the first electrode 506A and the second electrode 506B, the electric domain of the part of the ferroelectric single-crystal thin film layer 505 that is located between the first electrode 506A and the second electrode 506B for forming the storage unit is partially reversed (other parts of the ferroelectric single-crystal thin film layer 505 are not reversed). In this way, a domain wall conductive passage that connects the first electrode 506A with the second electrode 506B can be established in a substantially up-and-down direction.

Figure 6:
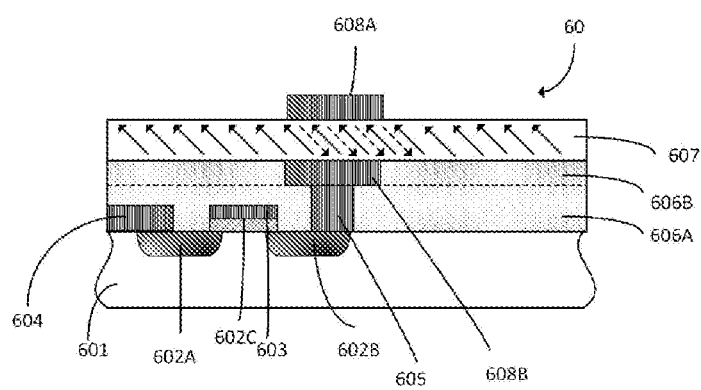
FIG. 6 is a schematic sectional structure view of a 1T1R structure of a ferroelectric memory unit of the integrated circuit for ferroelectric memory according to a sixth embodiment of the invention.

FIG. 6 is a schematic sectional structure view of a 1T1R structure of a ferroelectric memory unit of the integrated circuit for ferroelectric memory according to a sixth embodiment of the invention. As shown in FIG. 6, an integrated circuit 60 for ferroelectric memory may comprise a silicon-based reading and writing circuit 601 and a transistor array 602, wherein the silicon-based reading and writing circuit 601 can be for example formed by a single-crystal silicon substrate or the like, and the transistor array 602 can also be for example formed by a single-crystal silicon substrate or the like. The integrated circuit 60 for ferroelectric memory may also comprise bit lines 604, word lines 603 and a contact hole 605 in the insulation layer, wherein the bit lines 604 are connected with a source electrode or a drain electrode (e.g., the source electrode 602A) of the transistor 602 of the ferroelectric memory unit at the corresponding column of the ferroelectric memory array, and the word lines 603 are connected with the gate electrode 602C of the transistor 602 of the ferroelectric memory unit at the corresponding column of the ferroelectric memory array; for example, the word lines 603 are formed on the gate electrode 602C of the transistor 602 at the corresponding column by patterning. Conductive lines in the contact hole 605 can electrically connect the bit lines 604 with a second electrode 608B.

The integrated circuit 60 for ferroelectric memory may also comprise an insulation layer 606, a ferroelectric single-crystal thin film layer 607 and a first electrode 608A over the ferroelectric single-crystal thin film layer 607, wherein the first electrode 608A can also be a part of the electrode plate lines, and the electrode plate lines connect a plurality of first electrodes 608A of the storage unit of the ferroelectric memory unit at a corresponding row or column. The first electrodes 608A may be formed on upper and lower sides of the ferroelectric single-crystal thin film layer 607 in a way of being substantially aligned with the second electrodes 608B. The second electrodes 608B may be specifically formed in the insulation layer 606 by patterning. In this embodiment, the insulation layer 606 comprises a lower insulation layer 606A and an upper insulation layer 606B.

Similar to the embodiment shown in FIG. 5, a part of the ferroelectric single-crystal thin film layer 607 that is located between the first electrode 608A and the second electrode 608B constitutes the storage unit of the embodiment of the invention. Through the storage unit, a domain wall conductive passage that connects the first electrode 606A with the second electrode 608B can be established in a substantially up-and-down direction.

In the integrated circuits for ferroelectric memory according to the embodiments shown in FIGS. 1 to 6, the materials available for the ferroelectric single-crystal substrate or the ferroelectric single-crystal thin film layer can be selected from one or more of the followings: $LiTaO_3$, $LiNbO_3$ and $BiFeO_3$; or selected from one or more of the followings: $LiTaO_3$, $LiNbO_3$ and $BiFeO_3$ that are doped with MgO, $Mn_2O_5$ or $Fe_2O_3$, wherein the doped amount of the $LiTaO_3$ and $LiNbO_3$ that are doped with MgO, $Mn_2O_5$ or $Fe_2O_3$ can be 0.1-10 mol % (e.g., 1 mol % or 4 mol %).

In the integrated circuits for ferroelectric memory according to the embodiments shown in FIGS. 1 to 6, the polarization direction of the electric domain of the ferroelectric single-crystal layer (e.g., the ferroelectric single-crystal substrate or the ferroelectric single-crystal thin film layer) serving as the storage medium can be defined to have a component in the direction of a connecting line of the first electrode and the second electrode. This definition can be also understood in the following way: the polarization direction of the electric domain of the ferroelectric single-crystal layer forms a certain angle with the direction of the connecting line of the first electrode and the second electrode, and it has a component in the direction of the connecting line but is not perpendicular to the direction of the connecting line. In the embodiments as shown in FIGS. 1 to 4, the polarization direction of the electric domain forms an angle with the direction of the connecting line of the first electrode and the second electrode in-plane (or referred to as "transverse direction"), but it has a component in the direction of the connecting line; and in the embodiments as shown in FIGS. 5 to 6, the polarization direction of the electric domain of the ferroelectric single-crystal layer forms an angle with the direction of the connecting line of the first electrode and the second electrode out-of-plane (or referred to as "longitudinal direction"), but it has a component in the direction of the connecting line.

In the integrated circuits for ferroelectric memory according to the embodiments shown in FIGS. 1 to 4, each storage unit formed in the storage unit array of the ferroelectric single-crystal substrate or the ferroelectric single-crystal thin film layer has a regular bump pattern, and can be formed to have a convex shape on the surface of the ferroelectric single-crystal substrate using a semiconductor micro-nano processing technology. That is, the storage units are programming bumps that are relatively outwardly convex formed on the ferroelectric single-crystal substrate or the ferroelectric single-crystal thin film layer by patterning. Specifically, a storage array shape can be formed on the surface of the ferroelectric single-crystal substrate or the ferroelectric single-crystal thin film layer using methods such as optical exposure or electron beam etching or the like, and bump-shaped storage units are further formed by wet erosion or dry etching.

It will be understood that the bump is at least partially located between the first electrode and the second electrode. Since the polarization direction of the electric domain is substantially not parallel with a normal direction of the ferroelectric single-crystal substrate or the ferroelectric single-crystal thin film layer, when an electrical signal is applied between the first electrode and the second electrode, the electric domains of the ferroelectric single-crystals of at least a part of the bumps located substantially between the first electrode and the second electrode are partially reversed relative to the ferroelectric single-crystal substrate or the ferroelectric single-crystal thin film layer of other parts. A conductive domain wall can be formed between the reversed ferroelectric single-crystals and the relatively remaining unreversed ferroelectric single-crystals so that a conductive domain wall passage that connects the first electrode with the second electrode can be established.

In the integrated circuits for ferroelectric memory according to the embodiments shown in FIGS. 1 to 6, the reading and writing operations on the information stored in the storage unit are realized by biasing corresponding voltage signals onto the first and second electrodes through the electrode plate lines and bit lines. It should be noted that for the ferroelectric memory units of the 1T1R structure, it is further required to bias a corresponding gate electrode control signal onto the gate electrode of the transistor via word lines for the purpose of selectively switching on the transistor so as to further operate the storage units of the corresponding ferroelectric memory units.

In the integrated circuits for ferroelectric memory according to the embodiments shown in FIGS. 1 to 6, the selected electrode material is resistant to high temperature and has a low resistivity. The material of the first electrode and/or the second electrode may be but is not limited to one or more of the following materials: TiN, Pt, PtSi, NiSi, TiW, Ta, Ti, W, Mo, Al, Cu, Cr or $SrRuO_3$, $RuO_2$, etc. In the embodiments as shown in FIGS. 1 to 4, in addition to the first and second electrodes, a third electrode can be provided in correspondence to each storage unit. The third electrode is located between the first and second electrodes (e.g., disposed on the upper surface of the bump-like storage unit), and has a gap with the first electrode and the second electrode respectively.

In the integrated circuits for ferroelectric memory according to the embodiments shown in FIGS. 1 to 6, the height (h) of the bump of the storage unit may be larger than or equal to 2 nm and less than or equal to 5 μm, e.g., 100 nm; the width (w) of the first electrode and the second electrode may be larger than or equal to 1 nm and less than or equal to 1 μm, e.g., 100 nm; the spacing (d) between the first electrode and the second electrode may be larger than or equal to 1 nm and less than or equal to 1 μm, e.g., 100 nm; and the thickness of the first electrode and the second electrode may be larger than or equal to 1 nm and less than or equal to 500 nm, e.g., 50 nm.

In the integrated circuits for ferroelectric memory according to the embodiments shown in FIGS. 1 to 6, the insulation layer may comprise insulation materials such as $SiO_2$, $Al_2O_3$, $HfO_2$ or $Si_3N_4$; for example, the insulation layer is a $SiO_2$ thin film. The method of preparing the insulation layer may be selected from one of the following methods: chemical vapor deposition (CVD), physical vapor deposition (PVD), atomic layer deposition, etc.

In the integrated circuits for ferroelectric memory according to the embodiments shown in FIGS. 1 to 6, the circuit structure of the silicon-based reading and writing circuit is not limiting, and it can include corresponding circuits having various functions and required for realizing the operation of the memory. For example, it mainly includes a read-out current amplifying circuit, a reference circuit, an output comparator, an addressing circuit, etc. In some embodiments, during the reading operation, if the read-out current signal is small and cannot be detected by the circuit, the read-out current signal can be amplified by a certain number of times and then compared with a reference current so that the store logic state can be determined.

In the integrated circuits for ferroelectric memory according to the embodiments shown in FIGS. 1 to 6, a write voltage is biased onto the first and second electrodes in a first direction which is opposite to a projection direction of the polarization direction of the ferroelectric single-crystal substrate or the ferroelectric single-crystal thin film layer in the direction of the connecting line of the first electrode and the second electrode. That is, the first direction is a direction pointing to the second electrode from the first electrode. The magnitude of the write voltage is at least larger than the coercive field voltage of the storage unit, thus enabling the polarization direction of the electric domain in the storage unit to be completely reversed (partially reversed relative to other ferroelectric single-crystal substrates or ferroelectric single-crystal thin film layers in the storage unit). The arrows in broken lines in FIGS. 1 to 6 denote the reversed direction of polarization, which is opposite to the polarization direction of surrounding ferroelectric single-crystal substrates or ferroelectric single-crystal thin film layers that are not reversed. Therefore, a conductive domain wall is formed at the interface; after the biased write voltage is cancelled, the conductive domain wall does not disappear. This process is to write information "1" (i.e., a logic state of "1").

In the integrated circuits for ferroelectric memory according to the embodiments shown in FIGS. 1 to 6, a write voltage is biased onto the first and second electrodes in a second direction which is opposite to the first direction, a magnitude of which is at least larger than the coercive field voltage of the storage unit. The write voltage of the second direction enables the polarization direction of the electric domain in the storage unit to be completely reversed back to the original state, that is, the same as the original polarization direction in the ferroelectric single-crystal substrate or the ferroelectric single-crystal thin film layer. The conductive domain wall formed at the interface disappears. This process is to write information "0" (i.e., a logic state of "0").

In the integrated circuits for ferroelectric memory according to the embodiments shown in FIGS. 1 to 6, a write voltage is biased onto the first and second electrodes in the first direction, a magnitude of which is smaller than the coercive field voltage of the storage unit. The information can be read in a form of current. The read-out current is changed with the generation or disappearance of above domain wall having a low resistance. By comparing the read-out current with a reference current, the logic state of "0" or "1" can be identified. This process is to read information. Since the biased voltage is small and the polarization direction of the storage unit is already reversed, there is no influence on the polarization state of the electric domain of the storage unit, thus realizing a non-destructive reading.

In some other embodiments, when the integrated circuit for ferroelectric memory is an in-plane integrated circuit for ferroelectric memory, a third electrode can be also provided for each storage unit; in the read operation, when a read voltage is biased between the first electrode and the third electrode in the first direction, or a read voltage is biased between the third electrode and the second electrode in the first direction, the logic state of "0" or "1" can be identified can be identified by reading the magnitude of the current.

Figure 7:
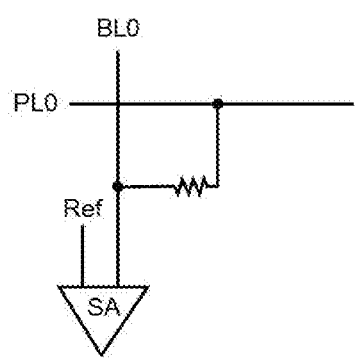
FIG. 7 is a circuit diagram of the crossbar structure of the ferroelectric memory unit according to the embodiment shown in FIG. 1 or 3 or 5.

FIG. 7 is a circuit diagram of the crossbar structure of the ferroelectric memory unit according to the embodiment shown in FIG. 1 or 3 or 5. With regard to the circuit diagram of the integrated circuit for ferroelectric memory of the examples shown in FIGS. 8 to 10, the ferroelectric memory array shown therein comprises a plurality of ferroelectric memory units arranged in rows and columns as shown in FIG. 7. In an example in which the bit lines BL are arranged in the direction of the columns and the plate lines PL (or referred to as driving lines) are arranged in the direction of the rows, the resistive storage units of the ferroelectric memory units connect the bit lines BL and the plate lines PL near the spatial cross points of the bit lines BL and the plate lines PL. By way of example, as shown in FIG. 7, the second electrode of the storage unit is connected with the bit line BL0, and the first electrode of the storage unit is connected with the plate line PL0. Assuming that the bit line BL0 and the plate line PL0 are selected based on an address signal and a corresponding read signal or write signal is biased, a reading operation or writing operation on the corresponding storage unit at the cross point of the bit line BL0 and the plate line PL0 can be realized. No reading operation or writing operation will be performed on other storage units that were not selected.

With continued reference to FIG. 7, each ferroelectric memory unit is mainly formed by one storage unit in the storage unit array. One end of the storage unit is connected with the plate line PL, and the other end is connected with the bit line BL. The bit line BL can be connected with a current comparator SA input by a reference current Ref so that the logic state currently stored in the storage unit can be read. In some embodiments, since the read-out current is small, it is required to arrange a current amplifier in front of the current comparator so as to amplify the current that is read out on the bit line.

It will be understood that the storage units in the ferroelectric memory unit can be resistive ferroelectric storage units. This is because the integrated circuit for ferroelectric memory that is provided can write data in a way of biasing the voltage, and can read out data in a way of reading the current. The magnitude of the current that is read reflects the magnitude of resistance of the storage unit to a certain extent, and the write operation of the storage unit reflects the variation of resistance of the storage unit to a certain extent. Therefore, in the embodiments of the invention, the storage unit can be denoted by R. The cross bar structure of the embodiment shown in FIG. 7 corresponds to a 0T1R structure (T denotes the transistor for selectively switching on).

Figure 8:
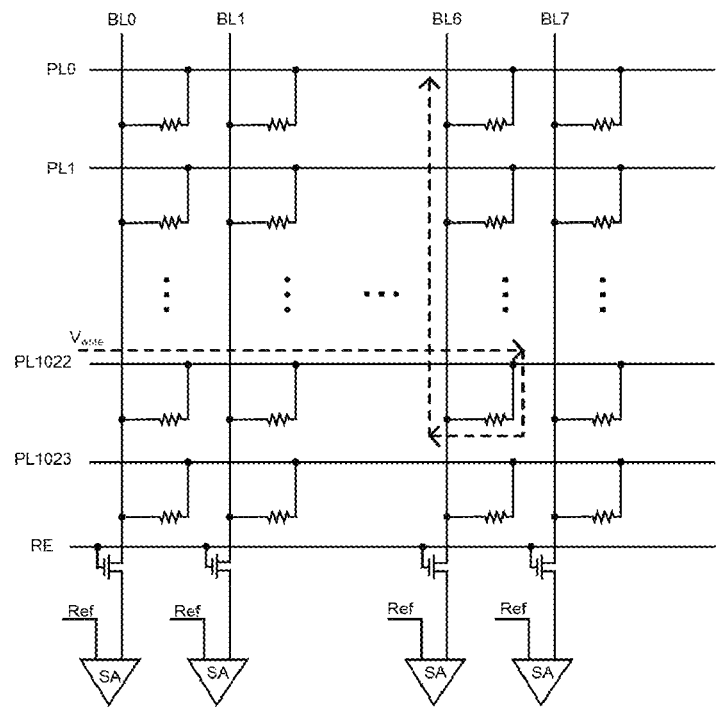
FIG. 8 illustrates a configuration operation diagram showing writing storage information "1" to a certain ferroelectric memory unit of the ferroelectric memory array of the integrated circuit for ferroelectric memory according to the embodiment shown in FIG. 1 or 3 or 5.
Figure 9:
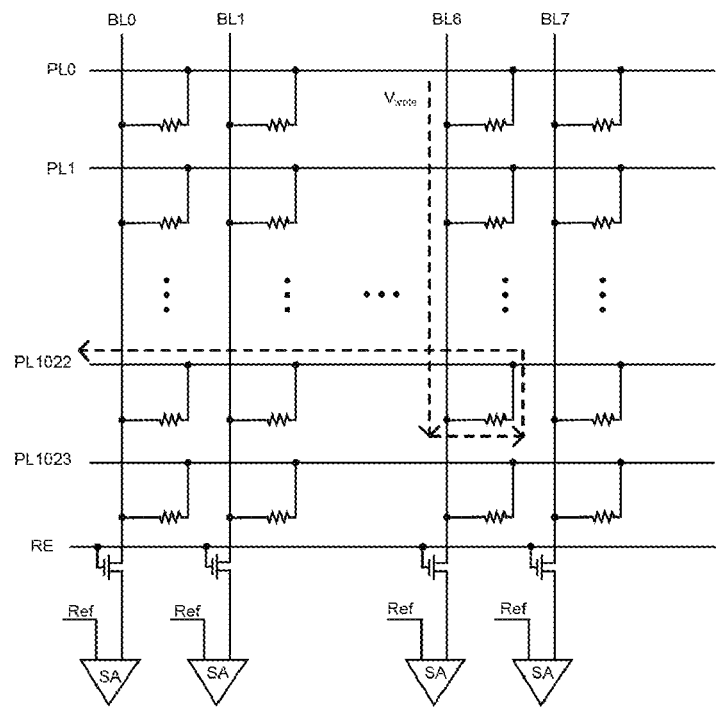
FIG. 9 illustrates a configuration operation diagram showing writing information "0" to a certain ferroelectric memory unit of the ferroelectric memory array of the integrated circuit for ferroelectric memory according to the embodiment shown in FIG. 1 or 3 or 5.
Figure 10:
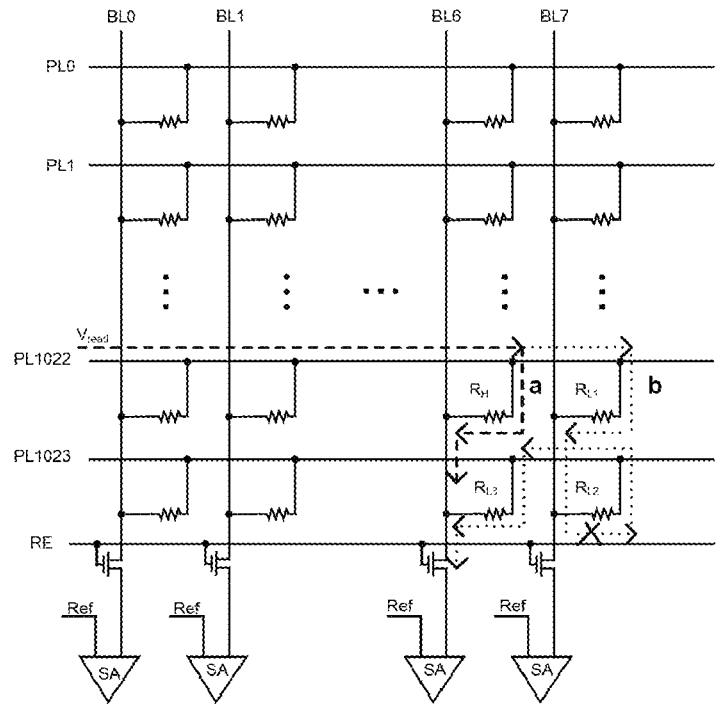
FIG. 10 illustrates a configuration operation diagram showing reading information from a certain ferroelectric memory unit of the ferroelectric memory array of the integrated circuit for ferroelectric memory according to the embodiment shown in FIG. 1 or 3 or 5.

FIGS. 8 to 10 illustrate a ferroelectric memory array of the integrated circuit for ferroelectric memory according to an embodiment of the invention, which is a 1024×8 storage array; that is, 1024×8 ferroelectric memory units of the crossbar structure of the embodiment shown in FIG. 7 are arranged in rows and columns.

As shown in FIGS. 8 to 10, the plate line PL is connected with the first electrode of the storage unit of the ferroelectric memory unit at a corresponding row, and the bit line BL is connected with the second electrode of the storage unit of the ferroelectric memory unit at a corresponding column. The read and write operations are performed by selecting a target storage unit by the plate line PL and the bit line BL. The read-out current of the storage unit has a switch characteristic; that is, in a case where a voltage is biased onto the first electrode and the second electrode in the first direction and there exists a conductive domain wall, there is a larger on-state current, and the read-out information is "1", which corresponds to a low resistance state; in other conditions such as when the domain wall disappears, an off-state current is read out, the read-out information is "0", which corresponds to a when the high resistance state.

In the ferroelectric memory array structure as shown in FIGS. 8 to 10, since it has a characteristic of larger ratio of on-state current and off-state current (i.e., on/off ratio) when the ferroelectric single-crystal layer forms the storage unit (e.g., the ratio of on-state current and off-state current cab be larger than $10^6$), there will be no crosstalk occurring to the storages units adjacent to the selected storage units, and the leakage power consumption is also small. Therefore, the transistor for selectively switching on can be directly omitted for each ferroelectric memory unit, thus forming a ferroelectric memory unit of a crossbar structure.

It will be understood that by using the ferroelectric memory unit of a crossbar structure, since the transistor is omitted, the ferroelectric memory unit and the ferroelectric memory array have a simple structure and a low cost, and the peripheral reading and writing circuit also becomes simple accordingly.

It is further noted that in the ferroelectric memory array structure, since the on-state read-out current can reach above $10^{-7}$ A for example when the ferroelectric single-crystal layer is used to form the storage unit, the readability of data is good.

FIG. 8 illustrates a configuration operation diagram showing writing storage information "1" to a certain ferroelectric memory unit of the ferroelectric memory array of the integrated circuit for ferroelectric memory according to the embodiment shown in FIG. 1 or 3 or 5. As shown in FIG. 8, the ferroelectric memory unit at the address of (1022,6) is selected to perform the operation of writing storage information "1"; firstly, the reading-enabled end RE is configured to be at a low electrical level so that the connection of the bit line and the current comparing circuit is cut off; then, the plate line PL1022 is configured to have a high voltage $V_{write}$, whose value is larger than the coercive field voltage of the storage unit, and other plate lines are suspended or configured to be at a half-height electrical level $V_{cc}/2$; meanwhile, the bit line BL6 is configured to be grounded, and other bit lines are suspended or configured to be at a half-height electrical level $V_{cc}/2$. As such, the write signal $V_{write}$ will be biased onto the storage unit of the ferroelectric memory unit at the address of (1022,6), and the electric domain of this storage unit will be reversed, thus successfully writing storage information "1".

After the above writing operation is completed, the driving line PL1022 and the bit line BL6 are suspended or configured to be at a half-height electrical level $V_{cc}/2$.

FIG. 9 illustrates a configuration operation diagram showing writing information "0" to a certain ferroelectric memory unit of the ferroelectric memory array of the integrated circuit for ferroelectric memory according to the embodiment shown in FIG. 1 or 3 or 5. As shown in FIG. 9, the ferroelectric memory unit at the address of (1022,6) is selected to perform the operation of writing storage information "0"; firstly, the reading-enabled end RE is configured to be at a low electrical level so that the connection of the bit line and the current comparing circuit is cut off; then, the bit line BL6 is configured to have a high voltage $V_{write}$, whose value is larger than the coercive field voltage of the storage unit, and other bit lines are suspended or configured to be at a half-height electrical level $V_{cc}/2$; meanwhile, the plate line PL1022 is configured to be grounded, and other plate lines are suspended or configured to be at a half-height electrical level $V_{cc}/2$. As such, the write signal $V_{write}$ will be biased onto the storage unit of the ferroelectric memory unit at the address of (1022,6), and the electric domain of this storage unit is restored to the original polarization direction, thus successfully writing storage information "0".

After the above writing operation is completed, the driving line PL1022 and the bit line BL6 are suspended or configured to be at a half-height electrical level $V_{cc}/2$.

FIG. 10 illustrates a configuration operation diagram showing reading information from a certain ferroelectric memory unit of the ferroelectric memory array of the integrated circuit for ferroelectric memory according to the embodiment shown in FIG. 1 or 3 or 5. As shown in FIG. 10, the ferroelectric memory unit at the address of (1022,6) is selected to perform the reading operation; firstly, the reading-enabled end RE is configured to be at a high electrical level so that the bit line BL is connected with the current comparing circuit; then, the driving line PL1022 is configured to have a read voltage $V_{rea}d$, whose value is smaller than the coercive field voltage of the storage unit, and other driving lines are suspended or configured to be at a half-height electrical level $V_{cc}/2$; meanwhile, the bit line BL6 is configured to be grounded, and other bit lines are suspended or configured to be at a half-height electrical level $V_{cc}/2$. As such, the read-out current is input into the current comparator and compared with the reference current, and the logic state stored in the ferroelectric memory unit at the address of (1022,6) is determined.

After the above reading operation is completed, the driving line PL1022 and the bit line BL6 are suspended or configured to be at a half-height electrical level $V_{cc}/2$.

Figure 11:
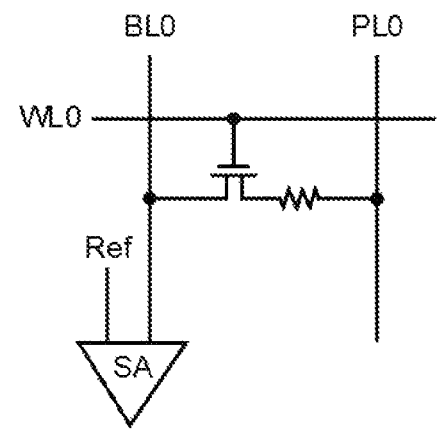
FIG. 11 is a circuit diagram of the 1T1R structure of the ferroelectric memory unit according to the embodiment shown in FIG. 2 or 4 or 6.

FIG. 11 is a circuit diagram of the 1T1R structure of the ferroelectric memory unit according to the embodiment shown in FIG. 2 or 4 or 6. With regard to the circuit diagram of the integrated circuit for ferroelectric memory of the examples shown in FIGS. 12 to 14, the ferroelectric memory array shown therein comprises a plurality of ferroelectric memory units arranged in rows and columns as shown in FIG. 11. In an example in which the bit lines BL and the plate lines PL (or referred to as driving lines) are arranged in the direction of the columns and the word lines WL are arranged in the direction of the rows, the resistive storage units R of the ferroelectric memory units and the transistors T connect the bit lines BL and the plate lines PL near the spatial cross points of the bit lines BL and the plate lines PL. By way of example, as shown in FIG. 11, the first electrode of the storage unit is connected with the plate line PL0, the second electrode of the storage unit is connected with the transistor T and is further connected with the bit line BL0 via the transistor T, and the transistor T of the storage unit is connected with the word line WL0. Assuming that the corresponding bit line BL0, plate line PL0 and word line WL0 are selected based on an address signal and a corresponding read signal or write signal is biased, a reading operation or writing operation on the selected storage unit can be realized. No reading operation or writing operation will be performed on other storage units that were not selected.

With continued reference to FIG. 11, each ferroelectric memory unit is mainly formed by one storage unit R in the storage unit array and one transistor T, that is, a 1T1R structure is formed. One end of the storage unit is connected with the plate line (PL0), and the other end is connected with one end of the source electrode and the drain electrode of the switch transistor T. The gate electrode of the transistor T is connected with the word line (WL0), and the other end of the source electrode and the drain electrode of the switch transistor T is connected with the bit line (BL0). The bit line BL can be connected with a current comparator SA input by a reference current Ref so that the logic state currently stored in the storage unit can be read.

Figure 12:
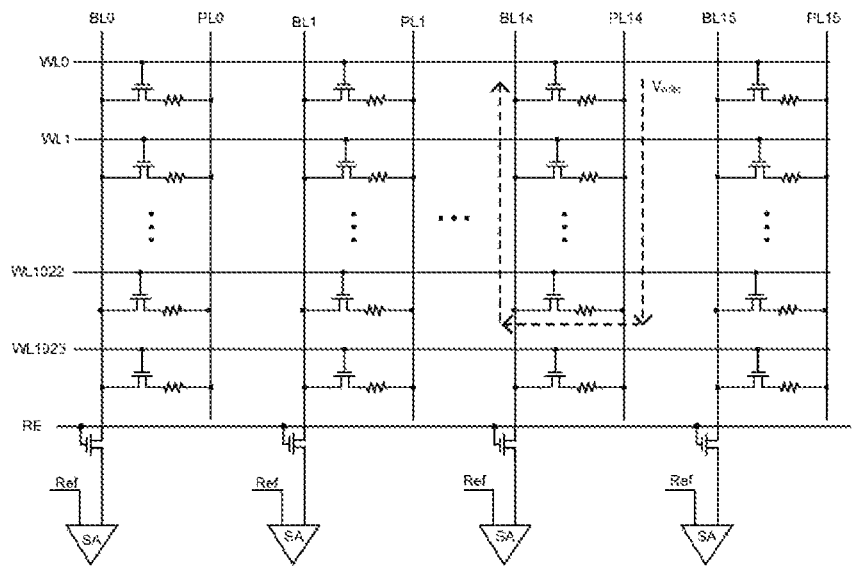
FIG. 12 illustrates a configuration operation diagram showing writing storage information "1" to a certain ferroelectric memory unit of the ferroelectric memory array of the integrated circuit for ferroelectric memory according to the embodiment shown in FIG. 2 or 4 or 6.
Figure 13:
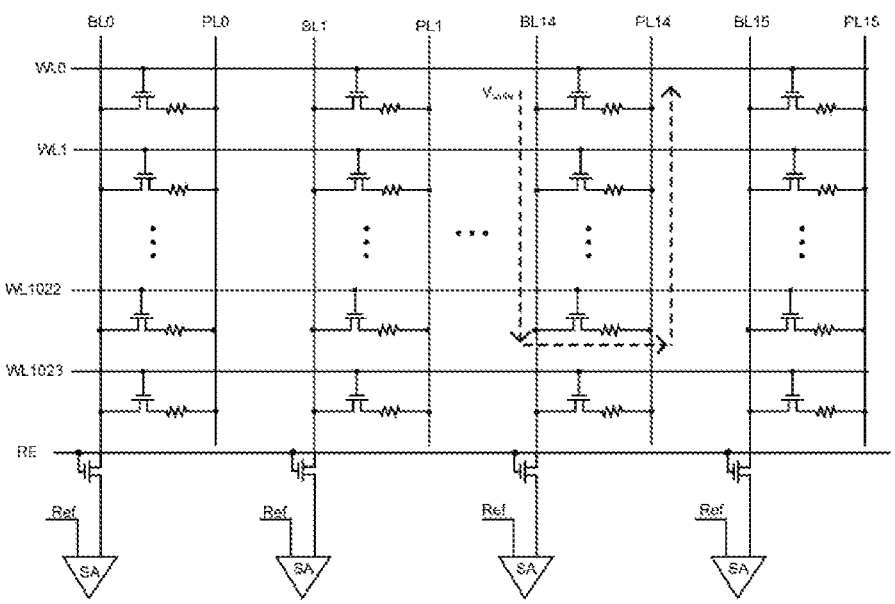
FIG. 13 illustrates a configuration operation diagram showing writing information "0" to a certain ferroelectric memory unit of the ferroelectric memory array of the integrated circuit for ferroelectric memory according to the embodiment shown in FIG. 2 or 4 or 6.
Figure 14:
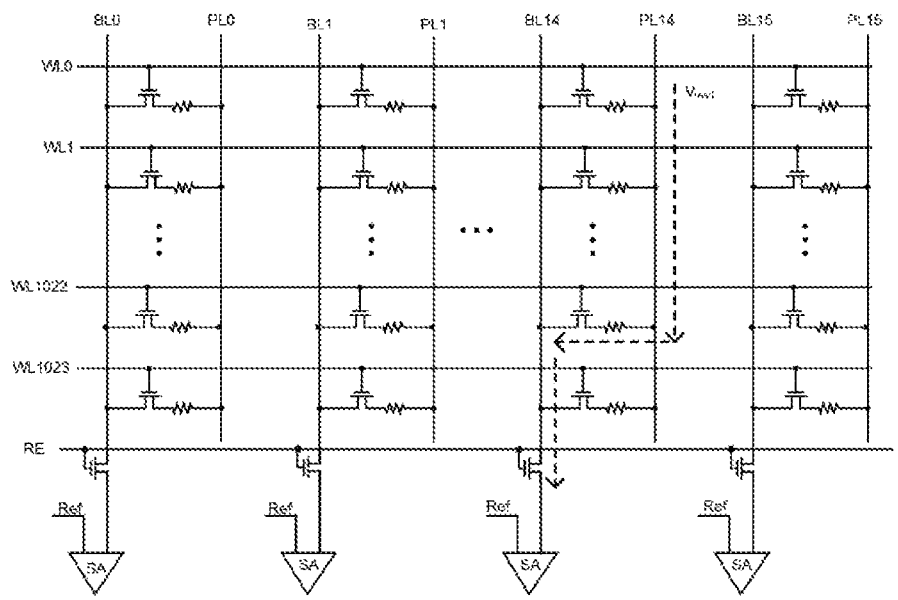
FIG. 14 illustrates a configuration operation diagram showing reading information from a certain ferroelectric memory unit of the ferroelectric memory array of the integrated circuit for ferroelectric memory according to the embodiment shown in FIG. 2 or 4 or 6.

FIGS. 12 to 14 illustrate a ferroelectric memory array of the integrated circuit for ferroelectric memory according to another embodiment of the invention, which is a 1024×16 storage array; that is, 1024×16 ferroelectric memory units of the 1T1R structure of the embodiment shown in FIG. 11 are arranged in rows and columns.

As shown in FIGS. 12 to 14, the plate line PL is connected with the first electrode of the storage unit of the ferroelectric memory unit at a corresponding row, the bit line BL is connected with the source electrode or the drain electrode of the transistor of the ferroelectric memory unit at a corresponding row, and the word line WL is connected with the gate electrode of the transistor of the ferroelectric memory unit at a corresponding row. A target storage unit can be selected by the plate line PL, the bit line BL and the word line WL so as to further perform reading and writing operations on the target storage unit that was selected.

In the ferroelectric memory array structure as shown in FIGS. 12 to 14, the ferroelectric memory unit of the 1T1R structure is used. Although it is structurally complicated as compared to the ferroelectric memory unit of the crossbar structure, it has advantageous characteristics in terms of reducing crosstalk and leakage current in the array, and is more suitable for an integrated circuit for ferroelectric memory of a larger array.

FIG. 12 illustrates a configuration operation diagram showing writing storage information "1" to a certain ferroelectric memory unit of the ferroelectric memory array of the integrated circuit for ferroelectric memory according to the embodiment shown in FIG. 2 or 4 or 6. FIG. 12 shows an expanded circuit of the ferroelectric memory unit as shown in FIG. 11, i.e., the ferroelectric memory array. As shown in FIG. 12, the ferroelectric memory unit at the address of (1022,14) is selected to perform the operation of writing storage information "1". Firstly, the reading-enabled end RE is configured to be at a low electrical level so that the connection of the bit line and the current comparing circuit is cut off; then, the plate line PL14 is configured to have a high voltage $V_{write}$, whose value is larger than the coercive field voltage of the storage unit, and other plate lines PL are suspended or configured to be at a half-height electrical level $V_{cc}/2$; the bit line BL14 is configured to be grounded, and other bit lines are suspended or configured to be at a half-height electrical level $V_{cc}/2$. As such, the write signal $V_{write}$ will be biased onto the storage unit of the ferroelectric memory unit at the address of (1022,14), and the electric domain of this storage unit will be reversed, thus successfully writing storage information "1".

After the above writing operation is completed, the plate line PL14 and the bit line BL14 are suspended or configured to be at a half-height electrical level $V_{cc}/2$, and the word line W1022 is also suspended or configured to be at a low electrical level.

FIG. 13 illustrates a configuration operation diagram showing writing information "0" to a certain ferroelectric memory unit of the ferroelectric memory array of the integrated circuit for ferroelectric memory according to the embodiment shown in FIG. 2 or 4 or 6. As shown in FIG. 13, the ferroelectric memory unit at the address of (1022,14) is selected to perform the operation of writing storage information "0". Firstly, the reading-enabled end RE is configured to be at a low electrical level so that the connection of the bit line and the current comparing circuit is cut off; then, the plate line PL14 is configured to be grounded, and other plate lines PL are suspended or configured to be at a half-height electrical level $V_{cc}/2$; the bit line BL14 is configured to have a high voltage $V_{write}$, whose value is larger than the coercive field voltage of the storage unit. As such, the write signal $V_{write}$ will be biased onto the storage unit of the ferroelectric memory unit at the address of (1022,14), and the electric domain of this storage unit is restored to the original polarization direction, thus successfully writing storage information "0".

After the above writing operation is completed, the plate line PL14 and the bit line BL6 are suspended or configured to be at a half-height electrical level $V_{cc}/2$, and the word line W1022 is also suspended or configured to be at a low electrical level.

FIG. 14 illustrates a configuration operation diagram showing reading information from a certain ferroelectric memory unit of the ferroelectric memory array of the integrated circuit for ferroelectric memory according to the embodiment shown in FIG. 2 or 4 or 6. As shown in FIG. 14, the ferroelectric memory unit at the address of (1022,14) is selected to perform the reading operation. Firstly, the reading-enabled end RE is configured to be at a high electrical level so that the bit line BL is connected with the current comparing circuit; then, the plate line PL14 is configured to have a voltage $V_{read}$, whose value is smaller than the coercive field voltage of the storage unit, and other plate lines PL are suspended or configured to be at a half-height electrical level $V_{cc}/2$; the bit line BL14 is configured to be grounded, and other bit lines BL are suspended or configured to be at a half-height electrical level $V_{cc}/2$. As such, the read-out current is compared with the reference current by the current comparator, and the logic state stored in the ferroelectric memory unit at the address of (1022,14) is determined.

After the above reading operation is completed, the driving line PL14 and the bit line BL14 are suspended or configured to be at a half-height electrical level $V_{cc}/2$, and the word line W1022 is also suspended or configured to be at a low electrical level.

Figure 15:
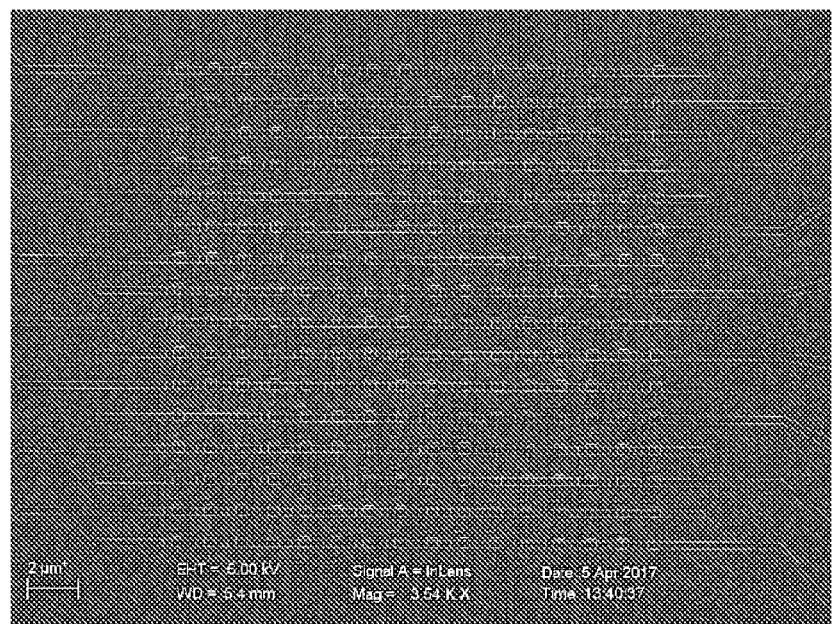
FIG. 15 is a SEM diagram of a sample of the ferroelectric memory array of ferroelectric memory unit having a crossbar structure according to an embodiment of the invention.

FIG. 15 is a SEM diagram of a sample of the ferroelectric memory array of ferroelectric memory unit having a crossbar structure according to an embodiment of the invention. In the sample of the ferroelectric memory array in FIG. 15, a LiNbO$_3$ ferroelectric single-crystal substrate doped with MgO of mo15% is used; each storage unit has a height of about 70 nm, the thickness of the first electrode and the second electrode is about 30 nm, and the width is about 100 nm. The first electrode is connected with the plate line PL, and a layer of SiO$_2$ insulation layer having a thickness of about 200 nm is deposited between the plate line PL and the bit line BL. The bit line BL is connected with the second electrode via a contact hole on the SiO$_2$ insulation layer, and is led out from the bit line BL and the plate line PL for testing.

Figure 16:
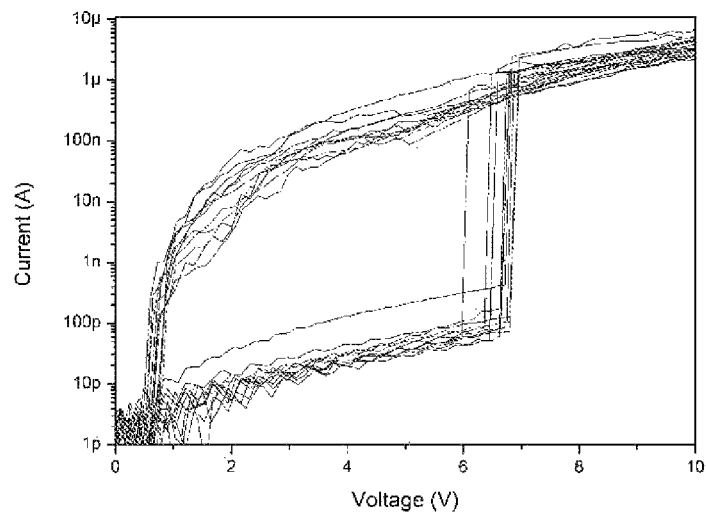
FIG. 16 is a schematic view showing I-V characteristic of the ferroelectric memory unit of the ferroelectric memory array according to the embodiment shown in FIG. 15, wherein the vertical coordinate takes a logarithmic form and the scanning voltage ranges from 0 to +10V.

FIG. 16 is an I-V test graph of 12 storage units picked up randomly from the samples of the embodiment of FIG. 15, i.e., an I-V graph of the ferroelectric memory unit; wherein the vertical coordinate takes a logarithmic form. Firstly, a voltage scans in positive direction biasing, and the range of the scanning voltage is 0 to 10V. Since the storage unit does not form a domain wall conductive passage at the beginning, the current is small after the voltage is biased, and the storage unit is at a high resistance state. When the scanning voltage is increased to be above the coercive field voltage of the storage unit, the storage unit forms a domain wall conductive passage, and the current is abruptly increased under a biasing voltage of for example 6V to 7V by an order of magnitude of about 4; when the scanning voltage is changed from 10V to 0V in the opposite direction, the storage unit is in a low resistance state and the current is large. This I-V scanning process completes the process of writing information into the storage unit, i.e., the process of forming the domain wall conductive passage.

As can be seen from FIG. 15, even the ferroelectric memory array of the embodiment of the invention employs a crossbar structure, the ratio of on-state current and off-state current of the ferroelectric memory unit measured in the array can be larger than $10^4$, and the crosstalk in the ferroelectric memory array is small.

Figure 17:
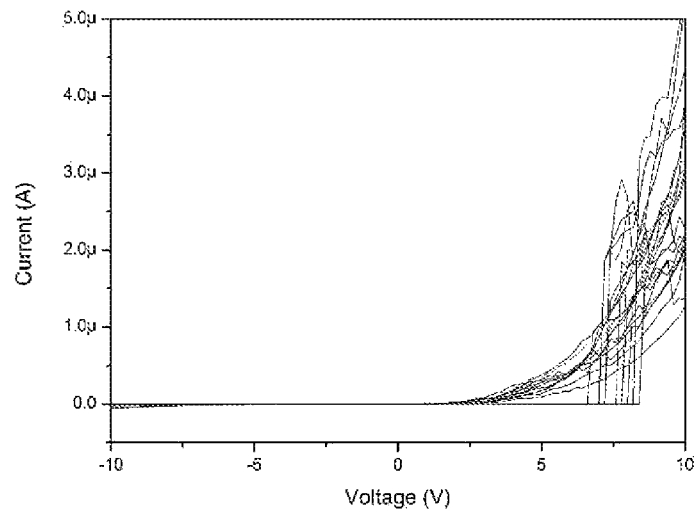
FIG. 17 is a schematic view showing I-V characteristic of the ferroelectric memory unit of the ferroelectric memory array according to the embodiment shown in FIG. 15, wherein the scanning voltage ranges from −10V to +10V.

FIG. 17 is an I-V test graph of 12 storage units picked up randomly from the samples of the embodiment of FIG. 15. A voltage scans from −10V to +10V, and then from +10V to −10V. It can be seen from the figure that the storage unit of the embodiment of FIG. 15 has an obvious switch characteristic. When the scanning voltage is in a negative direction, the stored units cannot be conducted on. That is, the low resistance state cannot be read out. It can be seen that the storage unit has a unidirectional conducting characteristic. For example, after the low resistance state of the domain wall conductive passage is formed by positive direction programming, if a negative direction voltage biases the storage unit, the low resistance state cannot be read out. The storage unit is enabled to exhibit the conducting low resistance state only when the same positive direction voltage is used to bias the storage unit. Therefore, when the ferroelectric memory unit of the crossbar structure of the embodiment of the invention is applied to the ferroelectric memory array, the unidirectional conducting characteristic of the storage unit naturally facilitates avoiding current crosstalk between the selected ferroelectric memory unit and surrounding ferroelectric memory units in the array. As shown in the example of FIG. 10, when the high resistance state of the storage unit $R_H$ is read, since the surrounding storage units $R_{L1}$, $R_{L2}$ and $R_{L3}$ are all in a low resistance state, even if the current tends to flow through path b (as indicated by the dot dash line path and direction in FIG. 10), due to the fact that the storage unit $R_{L2}$ cannot be conducted in the reverse direction, actually the current substantially flows only through path a (as indicated by the broken line path and direction in FIG. 10), and path b substantially does not produce current crosstalk, thereby reading out the high resistance state of the storage unit $R_H$. Therefore, it is highly suitable for use in the integrated circuit for ferroelectric memory of the ferroelectric memory unit having the crossbar structure.

It will be understood that after the negative direction programming forms the low resistance state of the domain wall conductive passage, if a positive direction voltage is used to bias the storage unit, the low resistance state also cannot be read out, and the storage unit is enabled to exhibit the conducting low resistance state only when the same negative direction voltage is used to bias the storage unit.

Figure 18:
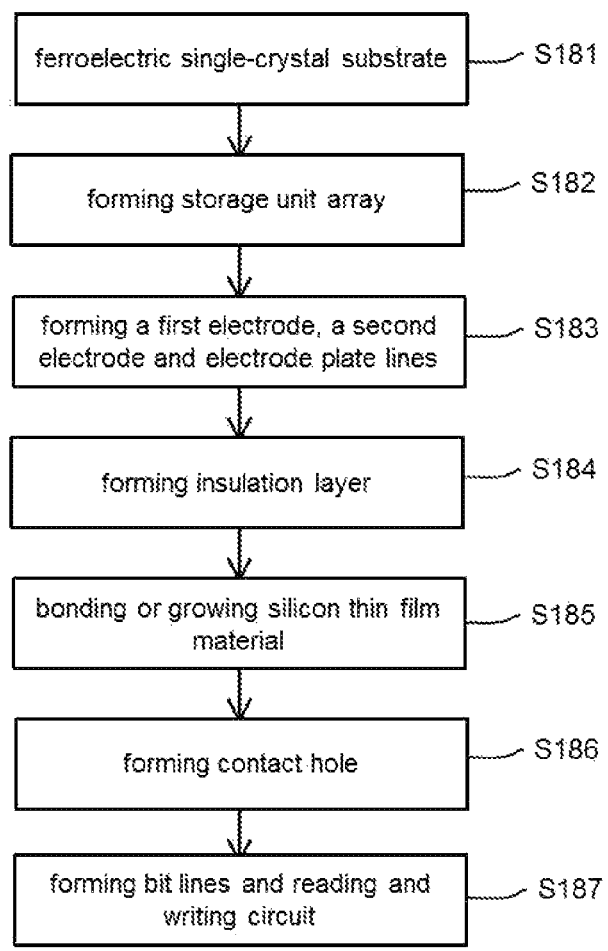
FIG. 18 illustrates a flowchart of a method of preparing of the integrated circuit for ferroelectric memory corresponding to the first embodiment shown in FIG. 1.

FIG. 18 illustrates a flowchart of a method of preparing of the integrated circuit for ferroelectric memory corresponding to the first embodiment shown in FIG. 1. As shown in FIGS. 1 and 8, firstly at step S181, a ferroelectric single-crystal substrate or ferroelectric single-crystal thin film layer is provided, and the ferroelectric material can be selected from one or more of the following materials: $LiTaO_3$, $LiNbO_3$ and $BiFeO_3$, or $LiTaO_3$, $LiNbO_3$ and $BiFeO_3$ that are doped with MgO, $Mn_2O_5$ or $Fe_2O_3$, etc.

Further, at step S182, a storage unit array is formed. In an embodiment, an array pattern is formed by optical exposure, electron beam exposure or the like, and then the array pattern is transferred to the surface of the ferroelectric single-crystal substrate or ferroelectric single-crystal thin film by means of wet etching or dry etching or the like, thus forming a bump array, i.e., the storage unit array.

Further, at step S183, a first electrode, a second electrode and electrode plate lines are formed. In an embodiment, an engraved electrode pattern is formed by optical exposure, electron beam exposure or the like, then electrode thin film material grows, and the electrode pattern is transferred onto the storage unit array by stripping or other processes; or the electrode thin film material grows firstly, and then an engraved electrode pattern is formed by optical exposure, electron beam exposure or the like, and the electrode pattern is transferred onto the storage unit array by means of wet etching or dry etching or the like. At this step, the first electrode, the second electrode and the electrode plate lines (or plate lines) PL can employ the same materials, and can be formed simultaneously.

Further, at step S184, an insulation layer can be formed. In an embodiment, an insulation layer grows on the ferroelectric single-crystal substrate, and the material of the insulation layer can be $SiO_2$, $Al_2O_3$, $HfO_2$, MgO or the like; however, it should be understood herein that the material of the insulation layer is not limited to the above exemplified types of insulation material. The growing method of the insulation material can be but is not limited to physical vapor deposition (PVD), chemical vapor deposition (CVD), atomic layer deposition, molecular beam epitaxy (MBE), laser pulse deposition, etc.

Further, at step S185, silicon thin film material is bonded or grows. In an embodiment, a silicon thin film layer is formed above the insulation layer using a SOI process. Specifically, the process of bonding silicon thin film material comprises injecting ions into a $Si/SiO_2$ substrate, bonding it onto a ferroelectric single-crystal substrate, stripping the remaining silicon, and chemically and mechanically polishing, etc. In another embodiment, the silicon thin film material can be also formed above the insulation layer by epitaxial growth method. It is noted that the above bonded or growing silicon material is merely an example of silicon-based materials. It will be understood that the silicon-based material can also be various semiconductor materials that are suitable for massively preparing peripheral circuits of the memory, for example, semiconductor materials that are suitable for preparing devices such as MOS tube using large scale integrated circuit process, e.g., GaAs, SiC, InP or other materials. Moreover, with the development of the technology of semiconductor material, various new semiconductor materials suitable for preparing peripheral circuits of the memory will emerge.

Further, at step S186, a contact hole is formed in the insulation layer. In an embodiment, an engraved contact hole pattern is formed by optical exposure, electron beam exposure or the like, then the contact hole pattern is transferred onto the insulation layer by means of wet etching or dry etching (reactive ion etching). Therefore, an interconnect passage is provided for the circuit formed in the silicon thin film in the upper layer and the storage unit formed in the lower layer.

Further, at step S187, bit lines and a reading and writing circuit are formed. In an embodiment, when the bit lines are formed, an engraved electrode pattern is formed by optical exposure, electron beam exposure or the like, electrode thin film material grows, and the electrode pattern is transferred to the ferroelectric memory array by stripping or other processes; or the electrode thin film material grows firstly, and then an engraved pattern is formed by optical exposure, electron beam exposure or the like, and the electrode pattern is transferred onto the ferroelectric memory array by means of wet etching or dry etching or the like. Moreover, the formed bit lines are connected with the storage unit at a corresponding column via the contact hole. In addition, the reading and writing circuit can be prepared using a standard CMOS process, thus forming a silicon-based reading and writing circuit; the reading and writing circuit may include but is not limited to a read-out current amplifying circuit, a reference current output circuit, an output current comparator, an addressing circuit, etc.

Figure 19:
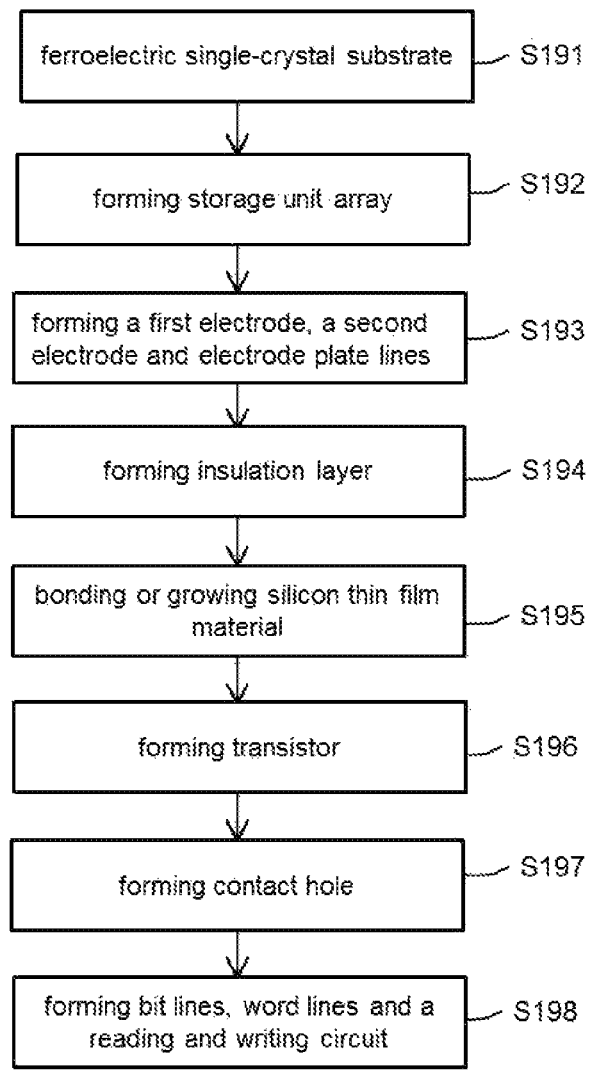
FIG. 19 illustrates a flowchart of a method of preparing of the integrated circuit for ferroelectric memory corresponding to the second embodiment shown in FIG. 2.

FIG. 19 illustrates a flowchart of a method of preparing of the integrated circuit for ferroelectric memory corresponding to the second embodiment shown in FIG. 2. As shown in FIGS. 2 and 19, the preparing method as shown in FIG. 19 is substantially similar to the preparing method exemplified in FIG. 18. The preparing method as shown in FIG. 19 has a main difference in that it further comprises a step S196 for forming a transistor T on the silicon-based thin film layer. That is, an array of transistors T is formed on the silicon-based thin film layer before the reading and writing circuit and bit lines are formed. Specifically, an array of transistors having a voltage gate-controlled switch is formed on the silicon thin film formed at step S195, one end of the source electrode and one end of the drain electrode of each transistor are electrically connected with bit lines, and other ends are electrically connected with an end of the storage unit in the lower layer. The steps S191, S192, S193, S194, S195, S197 and S198 in the preparing method as shown in FIG. 19 can be respectively identical or similar to the steps S181, S182, S183, S184, S185, S186 and S187 in the preparing method as shown in FIG. 18, and a description thereof is omitted herein.

Figure 20:
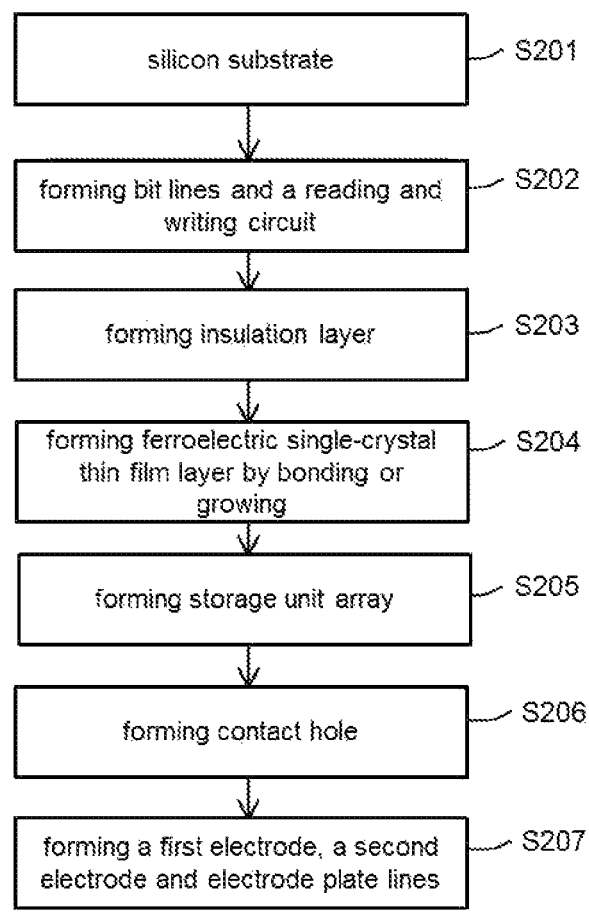
FIG. 20 illustrates a flowchart of a method of preparing of the integrated circuit for ferroelectric memory corresponding to the third embodiment shown in FIG. 3.

FIG. 20 illustrates a flowchart of a method of preparing of the integrated circuit for ferroelectric memory corresponding to the third embodiment shown in FIG. 3. As shown in FIGS. 20 and 3, in this embodiment, a silicon single-crystal substrate is used as a silicon-based substrate to form a peripheral reading and writing circuit or the like.

Firstly, at step S201, a silicon single-crystal substrate is provided, that is, a single-crystal silicon substrate is provided.

Further, at step S202, bit lines and a silicon-based reading and writing circuit are formed on the silicon single-crystal substrate using standard CMOS process for example, wherein the silicon-based reading and writing circuit includes but is not limited to a read-out current amplifying circuit, a reference current output circuit, an output current comparator, an addressing circuit, etc.

Further, at step S203, an insulation layer can be formed. In an embodiment, an insulation layer can grow on the silicon-based reading and writing circuit and bit lines, and the material of the insulation layer can be selected from insulation materials such as $SiO_2$, $Al_2O_3$, $HfO_2$, MgO or the like. The growing method of the insulation material can be but is not limited to physical vapor deposition (PVD), chemical vapor deposition (CVD), atomic layer deposition, molecular beam epitaxy (MBE), laser pulse deposition, etc.

Further, at step S204, a ferroelectric single-crystal thin film layer is bonded or grows on the insulation layer. In an embodiment, the ferroelectric single-crystal thin film layer serving as the ferroelectric single-crystal layer is formed above the insulation layer by bonding using a SOI process. Specifically, the process of forming the ferroelectric single-crystal thin film layer by bonding comprises injecting ions (H ions or He ions) into the surface of a ferroelectric single-crystal substrate, bonding the ferroelectric single-crystal on the insulation layer of the silicon single-crystal substrate, forming the ferroelectric single-crystal thin film layer bonded on the insulation layer by stripping, and finally chemically and mechanically polishing, etc. In another embodiment, the ferroelectric single-crystal thin film layer serving as the ferroelectric single-crystal layer can be also formed above the insulation layer by epitaxial growth method.

Further, at step S205, a storage unit array is formed on the surface of the ferroelectric single-crystal thin film layer. By way of example, an array pattern is formed by optical exposure, electron beam exposure or the like, and then the array pattern is transferred to the surface of the ferroelectric single-crystal substrate or ferroelectric single-crystal thin film by means of wet etching or dry etching or the like, thus forming a bump array, i.e., the storage unit array.

Further, at step S206, a contact hole is formed in the insulation layer. An engraved contact hole pattern is formed by optical exposure, electron beam exposure or the like, then the contact hole pattern is transferred onto the device by means of wet etching or dry etching (reactive ion etching). Therefore, an interconnect passage is provided for the storage unit in the upper layer and the silicon thin film circuit in the lower layer. In an embodiment, a contact hole is formed in the insulation layer. An engraved contact hole pattern is formed by optical exposure, electron beam exposure or the like, then the contact hole pattern is transferred onto the insulation layer by means of wet etching or dry etching (reactive ion etching). Therefore, an interconnect passage is provided for the storage unit formed in the upper layer and the bit lines BL formed on the silicon single-crystal substrate in the lower layer.

Further, at step S207, a first electrode, a second electrode and electrode plate lines are formed. In an embodiment, an engraved electrode pattern is formed by optical exposure, electron beam exposure or the like, then electrode thin film material grows, and the electrode pattern is transferred onto the storage unit array by stripping or other processes; or the electrode thin film material grows firstly, and then an engraved electrode pattern is formed by optical exposure, electron beam exposure or the like, and the electrode pattern is transferred onto the storage unit array by means of wet etching or dry etching or the like. At this step, the first electrode, the second electrode and the electrode plate lines (or plate lines) PL can employ the same materials, and can be formed simultaneously, wherein one of the first and second electrodes is connected with the bit lines on the silicon single-crystal substrate via the contact hole.

Figure 21:
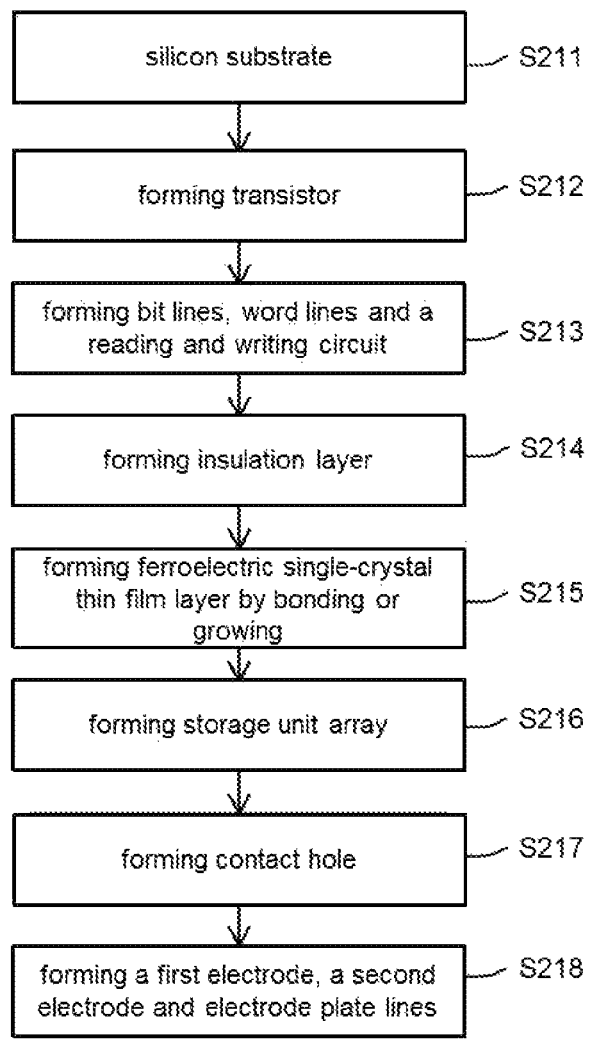
FIG. 21 illustrates a flowchart of a method of preparing of the integrated circuit for ferroelectric memory corresponding to the fourth embodiment shown in FIG. 4.

FIG. 21 illustrates a flowchart of a method of preparing of the integrated circuit for ferroelectric memory corresponding to the fourth embodiment shown in FIG. 4. As shown in FIGS. 4 and 21, the preparing method as shown in FIG. 21 is substantially similar to the preparing method exemplified in FIG. 20. The preparing method as shown in FIG. 21 has a main difference in that it further comprises a step S212 for forming a transistor T on the silicon single-crystal substrate. That is, an array of transistors T is formed on the silicon single-crystal substrate before the reading and writing circuit, word lines and bit lines are formed (i.e., step 213). Specifically, an array of transistors is formed on the silicon single-crystal substrate provided at step S211, one end of the source electrode and one end of the drain electrode of each transistor are electrically connected with bit lines, and other ends are electrically connected with an end of the storage unit in the lower layer. Moreover, word lines are formed at step 213, and the word lines are connected with the gate electrode of the transistor at the corresponding row. The steps S211, S213, S214, S215, S216, S217 and S218 in the preparing method as shown in FIG. 21 can be respectively identical or similar to the steps S201, S203, S204, S205, S206 and S207 in the preparing method as shown in FIG. 20, and a description thereof is omitted herein.

The above preparing methods of the examples of FIGS. 18 to 22 illustrate a basic preparing process of an in-plane integrated circuit for ferroelectric memory. A basic preparing process of an out-of-plane integrated circuit for ferroelectric memory will be illustrated below on the basis of the examples of FIGS. 22 and 23.

Figure 22:
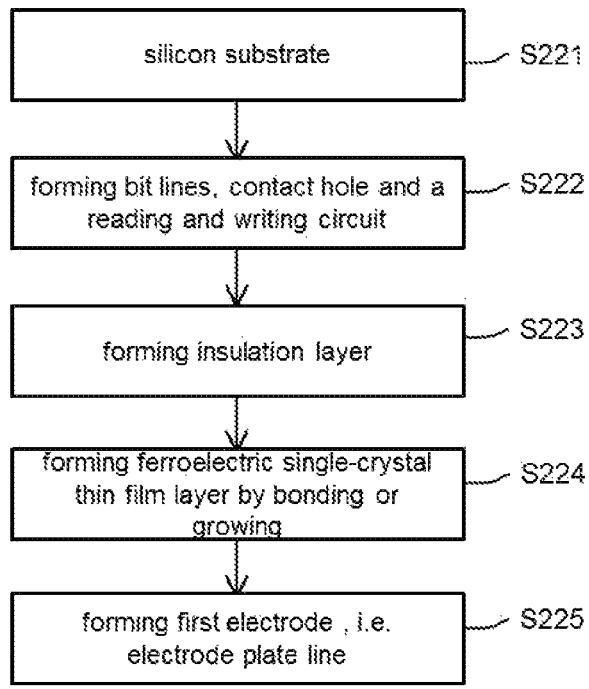
FIG. 22 illustrates a flowchart of a method of preparing of the integrated circuit for ferroelectric memory corresponding to the fifth embodiment shown in FIG. 5.

FIG. 22 illustrates a flowchart of a method of preparing of the integrated circuit for ferroelectric memory corresponding to the fifth embodiment shown in FIG. 5.

As shown in FIGS. 5 and 22, firstly, at step S221, a silicon single-crystal substrate is provided, that is, a single-crystal silicon substrate is provided.

Further, at step S222, bit lines and a silicon-based reading and writing circuit are formed on the silicon single-crystal substrate using standard CMOS process for example, and a contact hole 503 is further formed in the insulation layer 504A, wherein the silicon-based reading and writing circuit includes but is not limited to a read-out current amplifying circuit, a reference current output circuit, an output current comparator, an addressing circuit, etc.

Further, at step S223, an insulation layer such as 504B is deposited. This step is identical or similar to the step S203 in the example shown in FIG. 20, wherein an electrode array serving as the second electrode 506B and connected with the corresponding contact hole 503 is further formed in the insulation layer 504B by patterning, and the second electrode 506B is electrically connected with the corresponding bit line 502 via the contact hole 503.

Further, at step S224, a ferroelectric single-crystal thin film layer is bonded or grows on the insulation layer. This step is identical or similar to the step S204 in the example shown in FIG. 20.

Further, at step S225, a first electrode (electrode plate lines) is formed on a polished face of the ferroelectric single-crystal thin film layer, i.e., the first electrode and the electrode plate lines are formed integrally. A part of the ferroelectric single-crystal thin film layer between the first electrode 506A and the second electrode 506B forms the storage unit.

Figure 23:
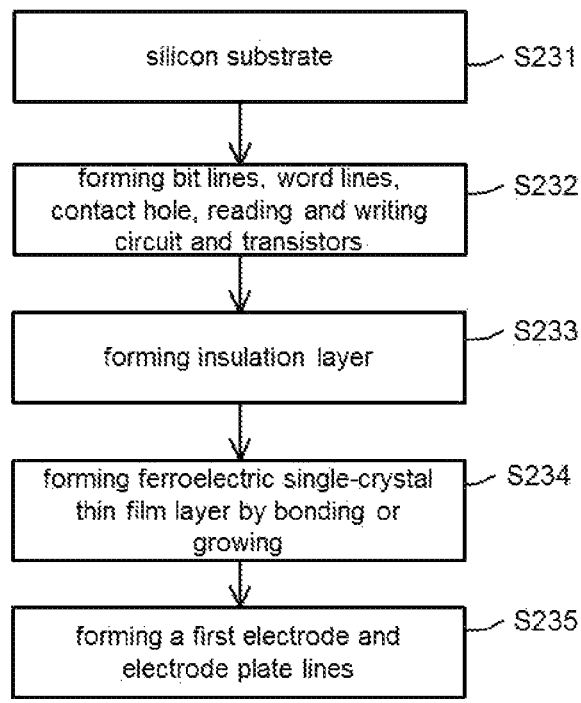
FIG. 23 illustrates a flowchart of a method of preparing of the integrated circuit for ferroelectric memory corresponding to the sixth embodiment shown in FIG. 6.

FIG. 23 illustrates a flowchart of a method of preparing of the integrated circuit for ferroelectric memory corresponding to the sixth embodiment shown in FIG. 6. As shown in FIGS. 6 and 23, the preparing method as shown in FIG. 23 is substantially similar to the preparing method exemplified in FIG. 22. The preparing method as shown in FIG. 23 has a main difference in that at step S232, a transistor T and a word line WL of the transistor T at a corresponding row are further formed on the silicon single-crystal substrate. Specifically, an array of transistors is formed on the silicon single-crystal substrate provided at step S231, one end of the source electrode and one end of the drain electrode of each transistor are electrically connected with bit lines, and other ends are electrically connected with an end of the storage unit in the upper layer (e.g., the second electrode 608B). Moreover, word lines, bit lines, a reading and writing circuit and a contact hole are formed at step 232, and the word lines are connected with the gate electrode of the transistor at the corresponding row. The steps S231, S233, S234 and S235 in the preparing method as shown in FIG. 23 can be respectively identical or similar to the steps S221, S223, S224, and S225 in the preparing method as shown in FIG. 22, and a description thereof is omitted herein.

As such, the integrated circuits for ferroelectric memory of the embodiments as shown in FIGS. 1 to 6 are substantially formed respectively.

It will be understood that the methods of preparing the integrated circuits for ferroelectric memory of the embodiments of the invention has less process steps and the process of preparing is not complicated, as compared to the conventional methods of preparing the FRAM of a ferroelectric capacitor structure. Moreover, the invention is compatible with the CMOS process.

In the above description, directional terms (e.g., "upper", "lower", etc.) and similar terms that are used to describe the components in various embodiments represent the directions shown in the drawings or directions that can be understood by those skilled in the art. These directional terms are used for a relative description and clarification, instead of limiting the orientation in any embodiment to a specific direction or orientation.

The above embodiments mainly describe the ferroelectric memory array, the integrated circuit for ferroelectric memory, the method of operating the reading/writing of the integrated circuit for ferroelectric memory and the method of preparing the reading/writing of the integrated circuit for ferroelectric memory of the invention. While only some of the embodiments of the invention are described, those skilled in the art will understand that the invention can be carried out in many other forms without departing from the spirit and scope thereof. For example, the shapes of the first electrode and the second electrode can be changed, and the arrangement of the integrated circuit for ferroelectric memory can be changed, etc. Therefore, the disclosed examples and embodiments should be considered as illustrative rather than limiting. The invention can cover many variations and replacements without departing from the spirit and scope of the invention defined by the appended claims.

What is claimed is:

1. An integrated circuit for ferroelectric memory, the integrated circuit comprising:
    a ferroelectric memory array having a storage unit array formed on a ferroelectric single-crystal layer, the storage unit array comprising at least one storage unit; and
    a silicon-based reading and writing circuit;
    wherein each storage unit in the storage unit array is correspondingly provided with a first electrode and a second electrode, and a polarization direction of the electric domain of the ferroelectric single-crystal layer is substantially not parallel with a normal direction of the ferroelectric single-crystal layer;
    wherein when an electrical signal is applied between the first electrode and the second electrode, the electric domain of the ferroelectric single-crystal layer for forming the storage unit and substantially located between the first electrode and the second electrode can be reversed, thus enabling establishment of a domain wall conductive passage which connects the first electrode with the second electrode; and
    wherein each ferroelectric memory unit in the ferroelectric memory array is at least formed by one storage unit in the storage unit array, or at least formed by one storage unit in the storage unit array and one transistor formed on the silicon substrate of the silicon-based reading and writing circuit and electrically connected to the storage unit.

2. The integrated circuit according to claim 1, wherein the integrated circuit is an in-plane reading and writing ferroelectric memory circuit, wherein the first electrode and the second electrode are substantially located on left and right sides of the storage unit, and the polarization direction of the electric domain of the storage unit has a component in the direction of the connecting line of the first electrode and the second electrode.

3. The integrated circuit according to claim 1, wherein:
(I) the integrated circuit for ferroelectric memory is an out-of-plane reading and writing ferroelectric memory circuit, wherein the first electrode and the second electrode are substantially located on upper and lower sides of the storage unit, and the polarization direction of the electric domain of the storage unit has a component in the direction of the connecting line of the first electrode and the second electrode;
(II) the integrated circuit for ferroelectric memory further comprises an insulation layer between the silicon-based reading and writing circuit and the ferroelectric single-crystal layer, and a contact hole is formed in the insulation layer;
(III) the ferroelectric single-crystal layer is a ferroelectric single-crystal substrate or a ferroelectric single-crystal thin film layer; or
(IV) combinations thereof.

4. The integrated circuit according to claim 1, wherein when each ferroelectric memory unit is at least formed by the one storage unit in the storage unit array, the ferroelectric single-crystal layer is a ferroelectric single-crystal substrate, and the silicon-based reading and writing circuit is formed above the ferroelectric single-crystal substrate, and wherein the integrated circuit for ferroelectric memory further comprises:
plate lines electrically connected with the first electrodes/the second electrodes of the storage units of the ferroelectric memory units at a corresponding row of the ferroelectric memory array; and
bit lines electrically connected with the second electrodes/the first electrodes of the storage units of the ferroelectric memory units at a corresponding column of the ferroelectric memory array.

5. The integrated circuit for ferroelectric memory according to claim 1, wherein when each ferroelectric memory unit is at least formed by the one storage unit and the one transistor, the ferroelectric single-crystal layer is a ferroelectric single-crystal substrate, and the silicon-based reading and writing circuit is formed above the ferroelectric single-crystal substrate, and wherein the integrated circuit for ferroelectric memory further comprises:
plate lines electrically connected with the first electrodes/the second electrodes of the storage units of the ferroelectric memory units at a corresponding column of the ferroelectric memory array;
word lines electrically connected with the gate electrodes of the transistors of the ferroelectric memory units at a corresponding row of the ferroelectric memory array; and
bit lines electrically connected with the source electrodes/drain electrodes of the transistors of the ferroelectric memory units at a corresponding column of the ferroelectric memory array.

6. The integrated circuit according to claim 4, wherein the plate lines are formed above the ferroelectric single-crystal substrate by patterning, the bit lines are formed above the silicon-based reading and writing circuit by patterning, and the bit lines are electrically connected with the second electrode/the first electrode of the storage unit of the ferroelectric memory unit at a corresponding column via a contact hole.

7. The integrated circuit according to claim 5, wherein the plate lines are formed above the ferroelectric single-crystal substrate by patterning, the bit lines are formed above the silicon-based reading and writing circuit by patterning, and the drain electrode/source electrode of the transistor are electrically connected with the second electrode/the first electrode of the storage unit of the ferroelectric memory unit at a corresponding column via a contact hole.

8. The integrated circuit according to claim 1, wherein when each ferroelectric memory unit is at least formed by the one storage unit in the storage unit array, the ferroelectric single-crystal layer is a ferroelectric single-crystal thin film layer, the silicon substrate for forming the silicon-based reading and writing circuit is a single-crystal silicon substrate, and the ferroelectric single-crystal substrate is formed above the single-crystal silicon substrate; wherein the integrated circuit for ferroelectric memory further comprises:
plate lines electrically connected with the first electrodes/the second electrodes of the storage units of the ferroelectric memory units at a corresponding row of the ferroelectric memory array; and
bit lines electrically connected with the second electrodes/the first electrodes of the storage units of the ferroelectric memory units at a corresponding column of the ferroelectric memory array.

9. The integrated circuit according to claim 1, wherein when each ferroelectric memory unit is at least formed by the one storage unit and the one transistor, the ferroelectric single-crystal layer is a ferroelectric single-crystal thin film layer, the silicon substrate for forming the silicon-based reading and writing circuit is a single-crystal silicon substrate, and the ferroelectric single-crystal substrate is formed above the single-crystal silicon substrate, and wherein the integrated circuit for ferroelectric memory further comprises:
plate lines electrically connected with the first electrodes/the second electrodes of the storage units of the ferroelectric memory units at a corresponding column of the ferroelectric memory array;
word lines electrically connected with the gate electrodes of the transistors of the ferroelectric memory units at a corresponding row of the ferroelectric memory array; and
bit lines electrically connected with the source electrodes/drain electrodes of the transistors of the ferroelectric memory units at a corresponding column of the ferroelectric memory array.

10. The integrated circuit according to claim 8, wherein the plate lines are formed above the ferroelectric single-crystal thin film layer by patterning, the bit lines are formed above the single-crystal silicon substrate by patterning, and the bit lines are electrically connected with the second electrode/the first electrode of the storage unit of the ferroelectric memory unit at a corresponding column via a contact hole.

11. The integrated circuit according to claim 9, wherein the plate lines are formed above the ferroelectric single-crystal thin film layer by patterning, the bit lines are formed above the single-crystal silicon substrate by patterning, and the drain electrode/source electrode of the transistor are electrically connected with the second electrode/the first electrode of the storage unit of the ferroelectric memory unit at a corresponding column via a contact hole.

12. The integrated circuit according to claim 1, wherein the ferroelectric materials used by for the ferroelectric single-crystal layer are selected from one or more of the following materials: $LiTaO_3$, $LiNbO_3$ and $BiFeO_3$; or selected from one or more of the following materials: LiTaO$_3$, LiNbO$_3$ and BiFeO$_3$ that are doped with MgO, Mn$_2$O$_5$ or Fe$_2$O$_3$ and, optionally, wherein the doped amount of the LiTaO$_3$ and LiNbO$_3$ that are doped with MgO, Mn$_2$O$_5$ or Fe$_2$O$_3$ is from about 0.1 to about 10 mol %.

13. The integrated circuit according to claim 1, wherein:
(I) the storage units are programming bumps that are relatively outwardly convex formed on the ferroelectric single-crystal layer;
(II) the material of the first electrode and/or the second electrode is selected from one or more of the following materials: TiN, Pt, PtSi, NiSi, TiW, Ta, Ti, W, Mo, Al, Cu, Cr, SrRuO$_3$, RuO$_2$;
(III) the polarization direction of the electric domain of the ferroelectric single-crystal layer forms a certain angle with the direction of the connecting line of the first electrode and the second electrode, and the electric domain has a component in the direction of the connecting line; or
(IV) combinations thereof.

14. A ferroelectric memory array, wherein the ferroelectric memory array comprises a storage unit array formed on a ferroelectric single-crystal layer, the storage unit array comprising at least one storage unit;
wherein each storage unit in the storage unit array is correspondingly provided with a first electrode and a second electrode, and a polarization direction of the electric domain of the ferroelectric single-crystal layer is substantially not parallel with a normal direction of the ferroelectric single-crystal layer;
wherein when an electrical signal is applied between the first electrode and the second electrode, the electric domain of the ferroelectric single-crystal layer for forming the storage unit and substantially located between the first electrode and the second electrode is reversed, thus enabling establishment of a domain wall conductive passage which connects the first electrode with the second electrode; and
wherein each ferroelectric memory unit in the ferroelectric memory array is at least formed by one storage unit in the storage unit array.

15. The ferroelectric memory array according to claim 14, when the storage unit is programmed to the logic state corresponding the domain wall conductive passage has established, the storage unit has a unidirectional conducting characteristic.

16. A method of operating the integrated circuit for ferroelectric memory according to claim 1, comprising:
a step of writing storage information "1", in which a write signal is applied between the first electrode and the second electrode in a first direction so that at least a part of the electric domain of the storage unit is reversed and the domain wall conductive passage is therefore established; and
a step of reading the storage information, in which a read signal is applied between the first electrode and the second electrode in the first direction and the magnitude of the voltage of the read signal is smaller than a coercive field voltage of the storage unit.

17. The method according to claim 16, further comprising:
a step of writing storage information "0", in which a write signal is applied between the first electrode and the second electrode in a second direction opposite to the first direction so that the reversed electric domain in the storage unit is reversed back to the original polarization direction and the domain wall conductive passage therefore disappears.

18. The method according to claim 16, wherein when each ferroelectric memory unit is at least formed by one storage unit in the storage unit array, the method of operating further comprises the following step:
selecting a plate line at the row corresponding to the ferroelectric memory unit to be operated and selecting a bit line at the column corresponding to the ferroelectric memory unit to be operated;
wherein the write signal is applied on the selected plate line or bit line.

19. The method according to claim 16, wherein when each ferroelectric memory unit is at least formed by one storage unit in the storage unit array and one transistor, the method of operating further comprises the following step:
selecting a plate line and a bit line at the row corresponding to the ferroelectric memory unit to be operated and selecting a word line at the column corresponding to the ferroelectric memory unit to be operated;
wherein the write signal or the read signal is applied onto the selected plate line and bit line, and a switch control signal that enables the transistor of the ferroelectric memory unit to be conducted is applied onto the selected word line.

20. A method according to claim 1, comprising the steps of:
providing a ferroelectric single-crystal substrate as a ferroelectric single-crystal layer;
patterning and forming the storage unit array on the ferroelectric single-crystal substrate;
patterning and forming the first electrode and the second electrode as well as plate lines connected with the first electrode/second electrode over the ferroelectric single-crystal substrate;
growing an insulation layer over the ferroelectric single-crystal substrate;
forming a silicon-based thin film layer over the insulation layer using a SOI process or epitaxial growing method; and
forming the silicon-based reading and writing circuit and bit lines on the silicon-based thin film layer.

21. The method according to claim 20, wherein when each ferroelectric memory unit is mainly formed by the one storage unit and the one transistor, the method further comprises the following steps:
forming an array of the transistors on the silicon-based thin film layer before forming the silicon-based thin film layer and the bit lines; and
patterning and forming the word lines connected to the gate electrode of the transistor over the array of the transistors.

22. A method of preparing the integrated circuit for ferroelectric memory according to claim 1, comprising the steps of:
providing a single-crystal silicon substrate;
forming the silicon-based reading and writing circuit and bit lines on the single-crystal silicon substrate;
growing an insulation layer over the silicon-based reading and writing circuit and bit lines;
forming a ferroelectric single-crystal thin film layer as a ferroelectric single-crystal layer over the insulation layer using a SOI process or epitaxial growing method;
patterning and forming the storage unit array on the ferroelectric single-crystal thin film layer; and patterning and forming the first electrode and the second electrode as well as plate lines connected with the first electrode/second electrode over the ferroelectric single-crystal thin film layer.

23. A method of preparing the integrated circuit for ferroelectric memory according to claim 1, comprising the steps of:

providing a single-crystal silicon substrate;

forming the silicon-based reading and writing circuit and bit lines on the single-crystal silicon substrate;

growing an insulation layer over the silicon-based reading and writing circuit and bit lines;

forming a first electrode in the insulation layer;

forming a ferroelectric single-crystal thin film layer as a ferroelectric single-crystal layer over the insulation layer using a SOI process or epitaxial growing method; and patterning and forming the second electrode which is substantially vertically aligned with the first electrode as well as plate lines connected with the second electrode over the ferroelectric single-crystal thin film layer.

* * * * *